(12) United States Patent
Tatsuta et al.

(10) Patent No.: US 12,294,793 B2
(45) Date of Patent: May 6, 2025

(54) SOLID-STATE IMAGING DEVICE, METHOD FOR DRIVING SOLID-STATE IMAGING DEVICE, AND ELECTRONIC APPARATUS

(71) Applicants: Brillnics Singapore Pte. Ltd., Singapore (SG); THE RITSUMEIKAN TRUST, Kyoto (JP)

(72) Inventors: Kazuki Tatsuta, Shiga (JP); Shunsuke Okura, Shiga (JP); Ken Miyauchi, Tokyo (JP); Hideki Owada, Tokyo (JP); Sangman Han, Tokyo (JP); Isao Takayanagi, Tokyo (JP)

(73) Assignees: BRILLNICS SINGAPORE PTE. LTD., Singapore (SG); THE RITSUMEIKAN TRUST, Kyoto (JP)

( * ) Notice: Subject to any disclaimer, the term of this patent is extended or adjusted under 35 U.S.C. 154(b) by 69 days.

(21) Appl. No.: 18/309,400

(22) Filed: Apr. 28, 2023

(65) Prior Publication Data

US 2023/0353898 A1     Nov. 2, 2023

(30) Foreign Application Priority Data

Apr. 28, 2022   (JP) ................................. 2022-074847

(51) Int. Cl.
    *H04N 25/65*      (2023.01)
    *H04N 25/77*      (2023.01)
    (Continued)

(52) U.S. Cl.
    CPC ............. *H04N 25/65* (2023.01); *H04N 25/77* (2023.01); *H04N 25/78* (2023.01); *H10F 39/80373* (2025.01); *H10F 39/80377* (2025.01)

(58) Field of Classification Search
CPC ........ H01L 27/14614; H01L 27/14616; H04N 25/77; H04N 35/78; H04N 25/771; H04N 25/59; H04N 25/76
See application file for complete search history.

(56) References Cited

U.S. PATENT DOCUMENTS

2008/0237446 A1    10/2008   Oshikubo et al.
2008/0266434 A1    10/2008   Sugawa et al.
(Continued)

FOREIGN PATENT DOCUMENTS

| EP | 2890117 A1 | 7/2015 |
|---|---|---|
| JP | 2005-328493 A1 | 11/2005 |
| JP | 2020-115603 A1 | 7/2020 |

OTHER PUBLICATIONS

European Patent Office, Extended European Search Report issued in EP 23170864.5, Sep. 8, 2023, pp. 1-11.

*Primary Examiner* — Kelly L Jerabek
(74) *Attorney, Agent, or Firm* — Pillsbury Winthrop Shaw Pittman LLP

(57) ABSTRACT

A solid-state imaging device, a method for driving a solid-state imaging device and an electronic apparatus are capable of reducing kTC noise of a LCG signal, preventing a drop in SNR at the conjunction point between a HCG signal and the LCG signal, and eventually achieving improved image quality. At a start of a reset period, first and second reset transistors are switched into a conduction state. During a predetermined first period after the reset period starts, the first reset line is kept connected to a reset potential. After the first period elapses, the second reset transistor is switched into a non-conduction state to switch the first reset line into a floating state, so that the first reset line has high impedance. After a second period elapses and when the reset period ends, the first reset transistor is switched into the non-conduction state.

20 Claims, 24 Drawing Sheets

(51) Int. Cl.
    *H04N 25/78*     (2023.01)
    *H10F 39/00*     (2025.01)

(56)     References Cited

U.S. PATENT DOCUMENTS

| | | | |
|---|---|---|---|
| 2015/0288898 A1* | 10/2015 | Yazawa | H04N 25/65 348/300 |
| 2016/0006969 A1* | 1/2016 | Matsumoto | H01L 27/14621 348/308 |
| 2016/0165160 A1* | 6/2016 | Hseih | H04N 25/65 348/308 |
| 2018/0302578 A1 | 10/2018 | Ebihara | |
| 2020/0075649 A1 | 3/2020 | Arishima et al. | |
| 2020/0236318 A1 | 7/2020 | Okura | |
| 2021/0385397 A1* | 12/2021 | Aoki | H04N 25/78 |
| 2022/0132067 A1* | 4/2022 | Mori | H04N 25/621 |
| 2022/0367557 A1* | 11/2022 | Ikuma | H04N 25/75 |

\* cited by examiner

With high impedance of CS side, channel charges will not move to CS.
(They will move to RD line)

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial No. 2022-074847 (filed on Apr. 28, 2022), the contents of which are incorporated herein.

TECHNICAL FIELD

The present invention relates to a solid-state imaging device, a method for driving a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

The CMOS image sensors include, for each pixel, a photodiode (a photoelectric conversion element) and a floating diffusion (FD) amplifier having a floating diffusion (FD). The mainstream design of the read-out operation in the CMOS image sensors is a column parallel output processing performed by selecting a row in a pixel array and reading the pixels simultaneously in the column direction.

The solid-state imaging devices (CMOS image sensors) can be constituted by, for example, basic 4-transistor (4Tr) pixels. The 4Tr pixels each include, for one photodiode (photoelectric conversion element), one transfer transistor serving as a transfer element, one reset transistor serving as a reset element, one source follower transistor serving as a source follower element and one selection transistor serving as a selection element.

The transfer transistor remains selected and in the conduction state during a predetermined transfer period to transfer to the floating diffusion FD the charges (electrons) produced by the photoelectric conversion and then stored in the photodiode. The reset transistor remains selected and in the conduction state during a predetermined reset period to reset the floating diffusion FD to the potential of a power supply line. The selection transistor remains selected and in the conduction state during a read-out scan. Thus, the source follower transistor outputs, to the vertical signal line, a read-out signal of a column output generated by the conversion performed by the floating diffusion FD to a voltage signal.

For example, in a read-out scan period, the floating diffusion FD is reset to the potential of the power supply line (the reference potential) in a reset period, the charges in the floating diffusion FD are then converted into a voltage signal with a gain corresponding to the FD capacitance, and the voltage signal is output to the vertical signal line as a read-out reset signal Vrst of the reference level (a signal of the reference level). Subsequently, in a transfer period, the charges (electrons) produced by the photoelectric conversion and then stored in the photodiode are transferred to the floating diffusion FD. The charges of the floating diffusion FD are converted into a voltage signal with a gain corresponding to the FD capacitance, and the voltage signal is output to the vertical signal line as a read-out signal Vsig of the signal level (a signal of the signal level). The output signals from the pixel are subjected to the CDS (correlated double sampling) process in the form of a differential signal (Vsig−Vrst) in a column reading circuit.

As described above, an ordinary pixel read-out signal (hereinafter also referred to as "pixel signal") PS includes one read-out reset signal Vrst of the reference level and one read-out signal Vsig of the signal level.

To improve characteristics, various methods have been proposed for fabricating solid-state imaging devices (CMOS image sensors) that have a high dynamic range (HDR) and provides a high picture quality.

One of the methods to increase the dynamic range is lateral overflow integration capacitor (LOFIC) (see, for example, Japanese Patent Application Publication No. 2005-328493). When having the LOFIC configuration, the pixels have a storage capacitor serving as a storage capacitance element and a storage transistor serving as a storage connection element in addition to the above-listed basic constituents, so that overflow charges overflowing from the photodiode within the same exposure period are not wasted but stored in the storage capacitor.

The LOFIC pixel can have two types of conversion gains: the conversion gain determined by the capacitance Cfd1 of the floating diffusion (high gain: proportional to 1/Cfd1); and the conversion gain determined by the sum of the capacitance Cfd1 of the floating diffusion and the LOFIC capacitance Clofic of the storage capacitor C2 (low gain: proportional to 1/(Cfd1+Clofic)). In other words, the LOFIC pixels can achieve high well capacity and low dark noise using the low conversion gain (LCG) signals and high conversion gain (HCG) signals. (See also Japanese Patent Application Publication No. 2020-115603)

The LOFIC architecture, however, has serious issues, or faces a reduced SNR at the conjunction (combination) point of a high conversion gain (HCG) signal and a low conversion gain (LCG) signal. More specifically, the LOFIC architecture alone can not remove kTC noise of the low conversion gain (LCG) signal, which results in a lower SNR at the conjunction point between the high conversion gain (HCG) signal and the low conversion gain (LCG) signal.

The high conversion gain (HCG) signal and the low conversion gain (LCG) signal have opposite signal directions. When the low conversion gain (LCG) is used to read the output signal from the pixel, the reset noise of the read-out reset signal VRL is different from the reset noise of the read-out luminance signal VSL. Therefore, subtraction process referred to as the differential double sampling (DDS) can hardly eliminate the noise.

SUMMARY

An object of the present invention is to provide a solid-state imaging device, a method for driving a solid-state imaging device, and an electronic apparatus that are capable of reading signals produced with different conversion gains and having different signal directions while reducing the kTC noise of the low conversion gain (LCG) signal, preventing a drop in SNR at the conjunction point between the high conversion gain (HCG) signal and the low conversion gain (LCG) signal and eventually achieving improved image quality.

A first aspect of the present invention provides a solid-state imaging device including: a pixel part having pixels arranged therein, each pixel including a photoelectric conversion element, each pixel being configured to produce, as a readable pixel signal, a read-out reset signal and a read-out signal with at least two conversion gains, the read-out reset signal corresponding to a reset state and the read-out signal being determined by charges stored in the photoelectric conversion element; a noise reducing part configured to perform noise reduction on the each pixel at least during a reset period; and a reading part configured to read the pixel signal from the pixel part while controlling the noise reduction performed by the noise reducing part. The each pixel has: the photoelectric conversion element configured to store therein, in an exposure period, charges corresponding to an amount of incident light; a floating diffusion configured to hold charges transferred thereto so that the charges are read out as a voltage signal, the floating diffusion being configured to convert the charges into voltage determined by a capacitance; and a reset element configured to perform a reset operation of discharging, into a reset potential, the charges stored at least in the floating diffusion; and a storage capacitance element configured to be connected to or disconnected from the floating diffusion according to a conversion gain. The reset element has: a first terminal connected to a first reset line connected to the reset potential; and a second terminal connected to a second reset line connected to at least one of the floating diffusion or the storage capacitance element, the floating diffusion being a target to be reset. If a control signal of a predetermined level is applied to the reset element in a reset period, electrical conduction is maintained between the first and second terminals. The noise reducing part, at least in a reset period during a read-out operation with at least one of the two conversion gains, keeps connection between the first reset line and the reset potential during a predetermined first period after the reset period starts, keeps the first reset line in a floating state in a second period after the first period elapses, so that the first reset line has high impedance. The reading part keeps the reset element in a conduction state for a predetermined period of time from a start of the reset period, and switches the reset element into a non-conduction state after the first and second periods elapse and when the reset period ends.

A second aspect of the present invention provides a method for driving a solid-state imaging device including: a pixel part having pixels arranged therein, each pixel including a photoelectric conversion element, each pixel being configured to produce, as a readable pixel signal, a read-out reset signal and a read-out signal with at least two conversion gains, the read-out reset signal corresponding to a reset state and the read-out signal being determined by charges stored in the photoelectric conversion element; a noise reducing part configured to perform noise reduction on the each pixel at least during a reset period; and a reading part configured to read the pixel signal from the pixel part while controlling the noise reduction performed by the noise reducing part. The each pixel has: the photoelectric conversion element configured to store therein, in an exposure period, charges corresponding to an amount of incident light; a floating diffusion configured to hold charges transferred thereto so that the charges are read out as a voltage signal, the floating diffusion being configured to convert the charges into voltage determined by a capacitance; a reset element configured to perform a reset operation of discharging, into a reset potential, the charges stored at least in the floating diffusion; and a storage capacitance element configured to be connected to or disconnected from the floating diffusion according to a conversion gain. The reset element has: a first terminal connected to a first reset line connected to the reset potential; and a second terminal connected to a second reset line connected to at least one of the floating diffusion or the storage capacitance element, the floating diffusion being a target to be reset. If a control signal of a predetermined level is applied to the reset element in a reset period, electrical conduction is maintained between the first and second terminals. At least in a reset period during a read-out operation with at least one of the two conversion gains, the reset element remains in a conduction state for a predetermined period of time from a start of the reset period and connection is kept between the first reset line and the reset potential during a predetermined first period after the reset period starts, the first reset line is kept in a floating state in a second period after the first period elapses, so that the first reset line has high impedance, and the reset element is switched into a non-conduction state after the first and second periods elapse and when the reset period ends.

A third aspect of the present invention provides an electronic apparatus including a solid-state imaging device; and an optical system for forming a subject image on the solid-state imaging device. The solid-state imaging device includes: a pixel part having pixels arranged therein, each pixel including a photoelectric conversion element, each pixel being configured to produce, as a readable pixel signal, a read-out reset signal and a read-out signal with at least two conversion gains, the read-out reset signal corresponding to a reset state and the read-out signal being determined by charges stored in the photoelectric conversion element; a noise reducing part configured to perform noise reduction on the each pixel at least during a reset period; and a reading part configured to read the pixel signal from the pixel part while controlling the noise reduction performed by the noise reducing part. The each pixel has: the photoelectric conversion element configured to store therein, in an exposure period, charges corresponding to an amount of incident light; a floating diffusion configured to hold charges transferred thereto so that the charges are read out as a voltage signal, the floating diffusion being configured to convert the charges into voltage determined by a capacitance; a reset element configured to perform a reset operation of discharging, into a reset potential, the charges stored at least in the floating diffusion; and a storage capacitance element configured to be connected to or disconnected from the floating diffusion according to a conversion gain. The reset element has: a first terminal connected to a first reset line connected to the reset potential; and a second terminal connected to a second reset line connected to at least one of the floating diffusion or the storage capacitance element, the floating diffusion being a target to be reset. If a control signal of a predetermined level is applied to the reset element in a reset period, electrical conduction is maintained between the first and second terminals. The noise reducing part, at least in a reset period during a read-out operation with at least one of the two conversion gains, keeps connection between the first reset line and the reset potential during a predetermined first period after the reset period starts, keeps the first reset line in a floating state in a second period after the first period elapses, so that the first reset line has high impedance. The reading part keeps the reset element in a conduction state for a predetermined period of time from a start of the reset period, and switches the reset element into a non-conduction state after the first and second periods elapse and when the reset period ends.

Advantageous Effects

The present invention can be applied to applications where signals produced with different conversion gains and having different signal directions are read, and can reduce the kTC noise of the low conversion gain (LCG) signal, prevent a drop in SNR at the conjunction point between the high conversion gain (HCG) signal and the low conversion gain (LCG) signal, and eventually achieve improved image quality.

DESCRIPTION OF THE PREFERRED EMBODIMENTS

Embodiments of the present invention will be hereinafter described with reference to the drawings.

First Embodiment

Figure 1:
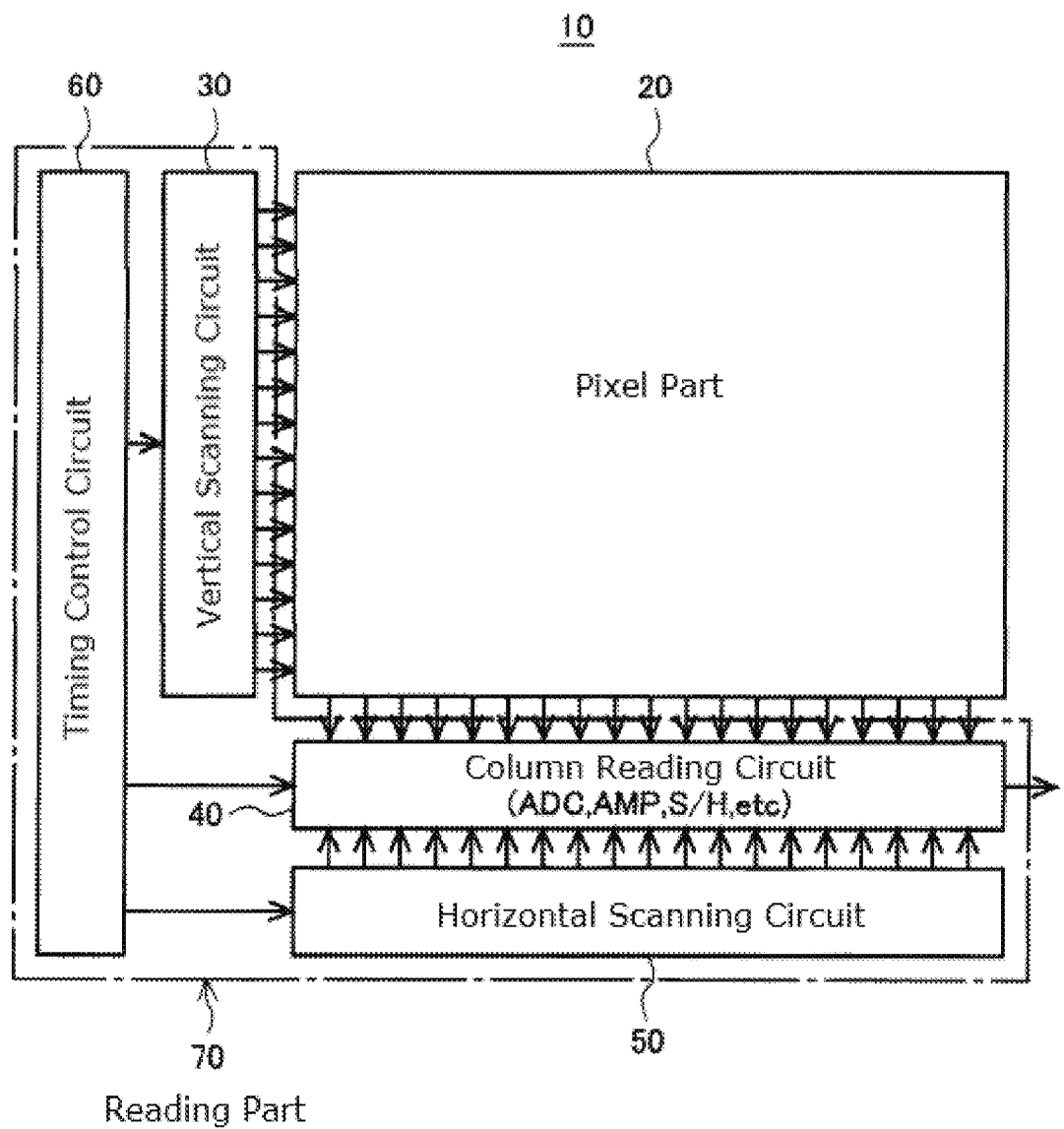
FIG. 1 is a block diagram showing an example configuration of a solid-state imaging device according to a first embodiment of the present invention.
Figure 2:
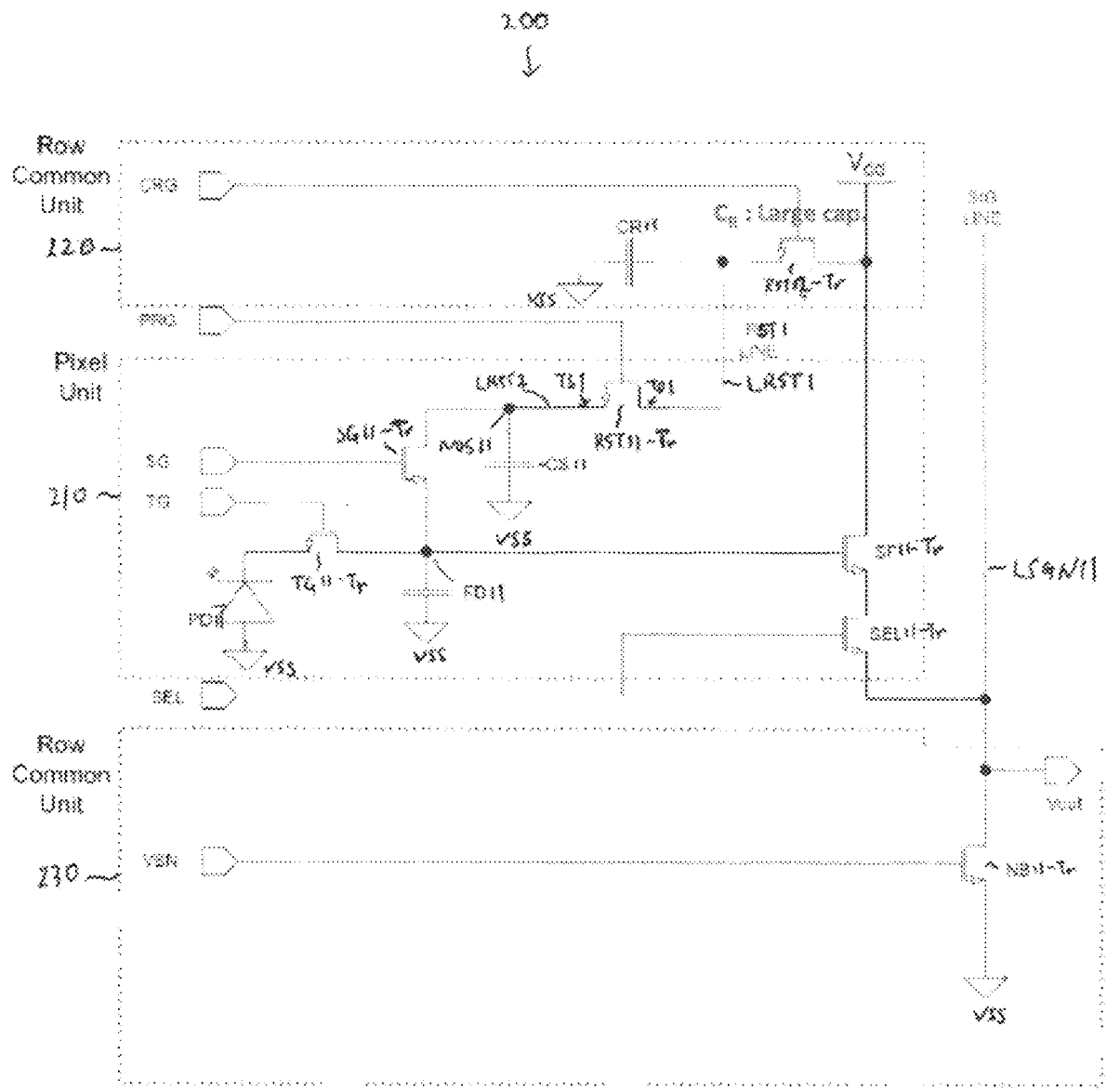
FIG. 2 is a circuit diagram showing an example configuration of a readable pixel and a noise reducing part in the first embodiment of the present invention.
Figure 3:
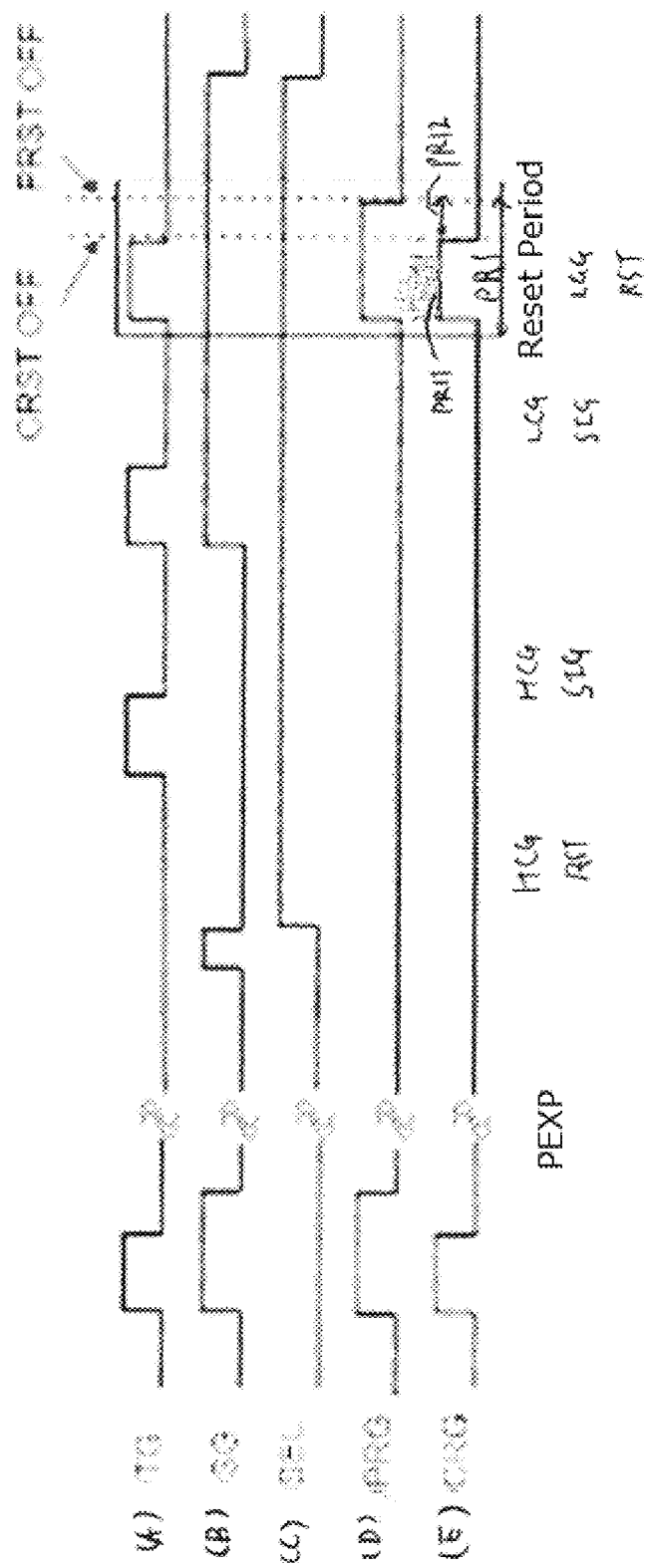
FIG. 3 is a timing chart to illustrate an example sequence of operations for reading performed on the readable pixel in the solid-state imaging device relating to the first embodiment of the present invention.

FIG. 1 is a block diagram showing an example configuration of a solid-state imaging device relating to a first embodiment of the present invention. FIG. 2 is a circuit diagram showing an example configuration of a readable pixel and a noise reducing part of the solid-state imaging device relating to the first embodiment of the present invention. FIG. 3 is a timing chart including parts (A) to (E) to illustrate an example sequence of operations for reading performed on the readable pixel and noise reducing part in the solid-state imaging device relating to the first embodiment of the present invention.

In this embodiment, a solid-state imaging device 10 is constituted by, for example, a CMOS image sensor.

As shown in FIG. 1, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute a reading part 70 for reading out pixel signals.

In the first embodiment, readable pixels 200 are arranged in a matrix pattern in the pixel part 20, and each readable pixel 200 is basically configured as shown in FIG. 2. More specifically, the readable pixel 200 is mainly constituted by a photoelectric conversion reading part 210, a noise reducing part 220, and a source follower constant current source 230. The photoelectric conversion reading parts 210 of the readable pixels 200 are basically arranged in a matrix pattern. In the present embodiment, one noise reducing part 220 and one source follower constant current source 230 are arranged for each row of the pixel array and used by the pixels 200 of the row. Alternatively, one noise reducing part 220 and one source follower constant current source 230 may be provided for each photoelectric conversion reading part 210.

The photoelectric conversion reading part 210 includes: a floating diffusion FD 11 storing therein the to-be-transferred charges so that the charges can be read in the form of a voltage signal; a photodiode PD11 serving as a photoelectric conversion element for storing, in an exposure period PEXP, therein the charges determined by the amount of incident light; a transfer transistor TG11-Tr serving as a transfer element for transferring to the floating diffusion FD11 the charges stored in the photodiode PD11 serving as the photoelectric conversion element, where the transfer transistor TG11-Tr remains in a non-conduction state during the exposure period PEXP and remains in a conduction state during a transfer period; and a first reset transistor RST11-Tr serving as a reset element for performing a reset operation of discharging the charges stored in the floating diffusion FD11.

The photoelectric conversion reading part 210 further includes: a storage capacitor CS11 serving as a storage capacitance element for storing therein overflow charges overflowing from the photodiode PD11 serving as the photoelectric conversion element; and a storage transistor SG11-Tr serving as the storage connection element for selectively connecting the floating diffusion FD11 and the storage capacitor CS11 serving as the storage capacitance element.

In addition, the photoelectric conversion reading part 210 may include an overflow path for allowing the charges, which overflow from the photodiode PD11 serving as the photoelectric conversion element toward the floating diffusion FD11 through the transfer transistor TG11-Tr, to overflow toward the region where the storage capacitor CS11 serving as the storage capacitance element is formed.

In the readable pixel 200, the capacitance CFD of the floating diffusion FD11 is very small for achieving a low noise. The capacitance CS1 of the storage capacitor CS11 is very large (electrostatic capacitance) for achieving a high full well capacity (FWC). The capacitance CS1 of the storage capacitor CS11 is greater than the capacitance CFD of the floating diffusion FD11. The capacitance CFD of the floating diffusion FD11 is mainly used for the high conversion gain, and the capacitance CS1 of the storage capacitor CS11 is additionally used for the low conversion gain.

The photodiode PD11 generates signal charges (electrons) in an amount determined by the amount of the incident light and stores the same. A description will be hereinafter given of a case where the signal charges are electrons and each field effect transistor is an n-type transistor. However, it is also possible that the signal charges are holes or each transistor is a p-type transistor.

In each readable pixel 200, the photodiode (PD) is a pinned photodiode (PPD). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

The transfer transistor TG11-Tr is connected between the photodiode PD11 and the floating diffusion FD11 and controlled through a control signal TG. The transfer transistor TG11-Tr remains selected and in the conduction state during a period in which the control signal TG is at the high (H) level, to transfer to the floating diffusion FD11 the charges (electrons) produced by photoelectric conversion by the photodiode PD11 and then stored in the storage node.

The first reset transistor RST11-Tr is formed by a field-effect transistor (an NMOS transistor in the present embodiment), and its drain terminal TD1 serving as a first terminal is connected to a first reset line LRST1, which is connected to a reset power supply potential (in the present embodiment, the power supply potential Vdd). The first reset transistor RST11-Tr has a source terminal TS1 serving as a second terminal, which is connected to a second reset line LRST2. The second reset line LRST2 is connected via a storage node NDS11 to the floating diffusion FD11, which is the target to be reset, and a storage capacitor CS11. The first reset transistor RST11-Tr is brought into a conduction or non-conduction state in response to a first reset control signal PRG.

The first reset transistor RST11-Tr remains selected, in the conduction state and connected to the potential Vdd during a period in which the control signal PRG is at the H level, to reset the floating diffusion FD11 (and the storage capacitor CS11) to the power supply potential Vdd while the storage transistor SG11-Tr remains in the conduction state.

In the first embodiment, the first reset transistor RST11-Tr, the storage transistor SG11-Tr and the transfer transistor TG11-Tr remain in the conduction state, so that the floating diffusion FD11 and the photodiode PD11 are reset. In the first embodiment, the first reset transistor RST11-Tr and the storage transistor SG11-Tr remain in the conduction state, so that the floating diffusion FD11 and the storage capacitor CS11 are reset.

The storage transistor SG11-Tr is connected between the floating diffusion FD11 and the storage capacitor CS11 (and the first reset transistor RST11-Tr) via the storage node NDS11. The storage transistor SG11-Tr is controlled by the control signal SG applied to the gate thereof through the control line. The storage transistor SG11-Tr remains selected and in the conduction state during a period in which the control signal SG is at the H level, to connect the floating diffusion FD11 and the storage capacitor CS11 (and the first reset transistor RST11-Tr). In the first embodiment, the first reset transistor RST11-Tr and the storage transistor SG11-Tr remain in the conduction state, so that the floating diffusion FD11 and the storage capacitor CS11 are reset, as mentioned above.

In the first embodiment, the overflow path is formed so as to allow the overflow charges of the photodiode PD11 to overflow into the storage capacitor CS11 through the floating diffusion FD11, the storage transistor SG11-Tr, the storage node NDS11, and also formed so as to allow the overflow charges of the storage capacitor CS11 to overflow into the power supply potential Vdd through the storage node NDS11 and the first reset transistor RST11-Tr.

A source follower transistor SF11-Tr and a selection transistor SEL11-Tr are connected in series between the power supply potential Vdd and the vertical signal line LSGN11. The gate of the source follower transistor SF11-Tr is connected to the floating diffusion FD11, and the selection transistor SEL11-Tr is controlled by a control signal SEL applied to the gate thereof through a control line. The selection transistor SEL11-Tr remains selected and in the conduction state during a selection period in which the control signal SEL is at the H level. In this way, the source follower transistor SF11-Tr outputs, to the vertical signal line LSGN11, a read-out voltage signal (VRST1, VSIG1) of a column output, which is a voltage signal produced through the conversion performed by the floating diffusion FD11.

The photoelectric conversion reading part 210 further includes the source follower transistor SF11-Tr serving as a source follower element and the selection transistor SEL11-Tr serving as a selection element. The source follower transistor SF11-Tr cooperates with the source follower constant current source 230 to output the voltage signal produced by the conversion by the floating diffusion FD11.

The readable pixel 200 relating to the present embodiment is configured to, under control of the reading part 70, change the capacitance of the floating diffusion FD11 between a first capacitance and a second capacitance to change the conversion gain between a first conversion gain (for example, high conversion gain: HCG) corresponding to the first capacitance and a second conversion gain (for example, low conversion gain: LCG) corresponding to the second capacitance, by selectively connecting the floating diffusion FD11 to the storage capacitor CS11 serving as the storage capacitance element through the storage transistor SG11-Tr serving as the storage connection element.

As described above, the solid-state imaging device 10 is configured to perform, under control of the reading part 70, first conversion gain mode read-out and second conversion gain mode read-out in a designated dual conversion gain read-out mode period as shown in FIG. 3. In the first conversion gain mode read-out, pixel signals are read with the first conversion gain (high conversion gain (HCG)) corresponding to the first capacitance, and in the second conversion gain mode read-out, pixel signals are read with the second conversion gain (low conversion gain: LCG) corresponding to the second capacitance (different from the first capacitance).

The readable pixel 200 has, for example, a lateral overflow integration capacitor (LOFIC), so that a dual-sampling read-out mode (LOFIC mode) operation can be performed in a high illuminance circumstance under control of the reading part 70. In the LOFIC mode operation, the second conversion gain is used, which is related to the charges stored in the photodiode PD11 serving as the photoelectric conversion element and the stored overflow charges.

The readable pixel 200 relating to the first embodiment can be subject to the dual conversion gain signal read-out involving the first conversion gain signal read-out according to which the pixel signals are read with the first conversion gain (for example, high conversion gain: HCG) corresponding to the first capacitance and the second conversion gain signal read-out according to which the pixel signals are read with the second conversion gain (for example, the low conversion gain: LCG) corresponding to the second capacitance (different from the first capacitance). In the first embodiment, the read-out operation for the readable pixel 200 involves, in a first conversion gain signal read-out mode, reading a first read-out reset signal HCGRST and subsequently a first read-out luminance signal HCGSIG, as shown in FIG. 3. In a subsequent second conversion gain signal read-out mode, a second read-out luminance signal LCGSIG and a second read-out reset signal LCGRST are sequentially read out.

Accordingly, the first conversion gain signal (HCGRST, HCGSIG) and the second conversion gain signal (LCGSIG, LCGRST) read out as the pixel signal PXLOUT from the readable pixel 200 have opposite signal directions (opposite level transitioning directions).

The high conversion gain (HCG) signal and the low conversion gain (LCG) signal have opposite signal directions. When the low conversion gain (LCG) is used to read the pixel signal, the reset noise of the read-out reset signal VRL is different from the reset noise of the read-out luminance signal VSL. Therefore, subtraction referred to as the differential double sampling (DDS) can hardly eliminate the noise. To overcome this issue, the present embodiment provides the noise reducing part 220 for enabling a high conversion gain signal and a low conversion gain signal, which are produced with different conversion gains and have different signal directions, to be read while reducing kTc noise of the low conversion gain (LCG) signal and preventing a drop in SNR at the conjunction point of the high conversion gain (HCG) signal and the low conversion gain (LCG) signal. In the present embodiment, the noise reducing part 220 is controlled by the reading part 70 to perform noise reduction in a reset period associated with reading of the second read-out reset signal LCGRST (a first reset operation).

<Specific Configuration and Function of Noise Reducing Part 220>

The following now describes the more specific configuration and function of the noise reducing part 220 relating to the first embodiment.

<Configuration of Noise Reducing Part 220>

In a reset period PR1 of a read-out operation with at least one (LCG) of the two conversion gains (HCG and LCG), the noise reducing part 220 of the present embodiment keeps the first reset line LRST1 connected to the reset potential or the power supply potential Vdd during a predetermined first period PR11 that starts when the reset period PR1 starts. After the first period PR11 elapses, a second period PR12 starts. In the second period PR12, the noise reducing part 220 switches the first reset line LRST1 into the floating state, so that the first reset line LRST1 can have high impedance. In this case, the reading part 70 keeps the first reset transistor RST11-Tr in the conduction state for a predetermined period of time from the start of the reset period PR1. After the first period PR11 and the second period PR12 elapse, the reset period PR1 ends. At the end of the reset period PR1, the reading part 70 switches the first reset transistor RST11-Tr into the non-conduction state.

As shown in FIG. 2, the noise reducing part 220 includes a second reset transistor RST12-Tr and a reset control capacitor CR11. The second reset transistor RST12-Tr is connected between the first reset line LRST1 and the power supply potential Vdd, which is the reset potential, and switched between the conduction state and the non-conduction state in response to a second reset control signal CRG. The reset control capacitor CR11 serves as a reset control capacitance element connected to the first reset line LRST1. The second reset transistor RST12-Tr is formed by an NMOS transistor, like the first reset transistor RST11-Tr. The capacitance CR of the reset capacitor CR11 is greater than the capacitance CFD of the floating diffusion FD11, which is the target to be reset (CR>CFD).

Figure 4:
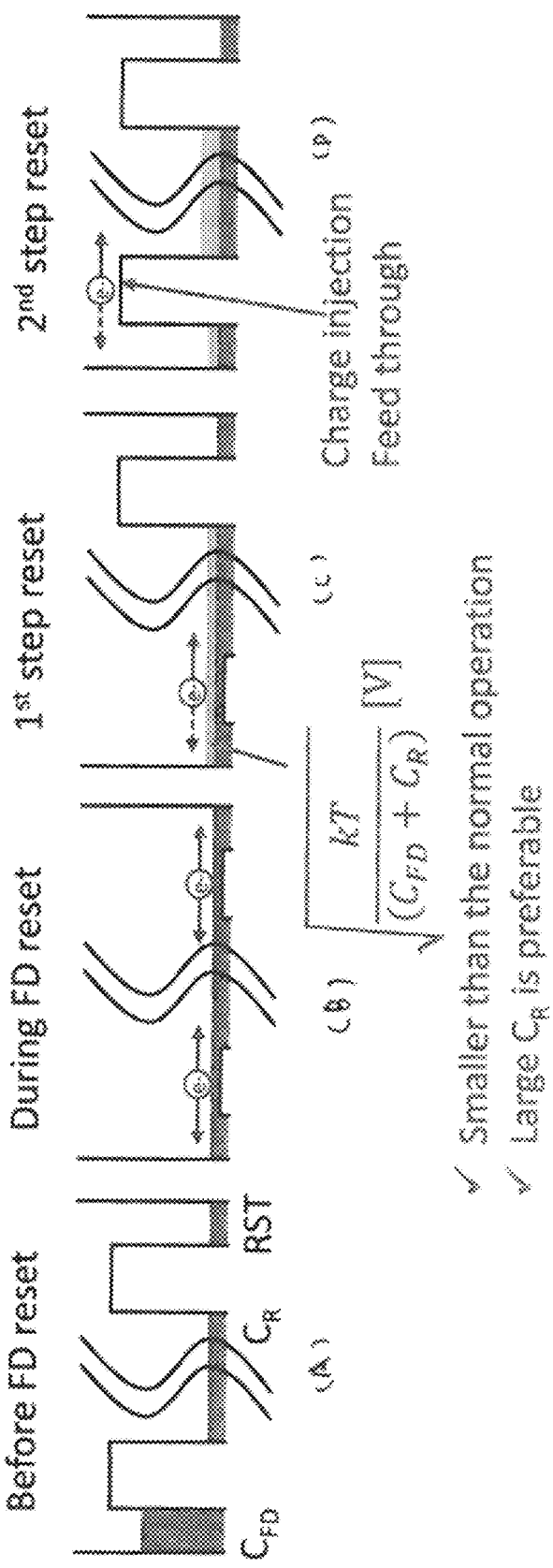
FIG. 4 shows how the potential transitions during noise reduction performed on the floating diffusion using the noise reducing part relating to the first embodiment of the present invention.
Figure 5:
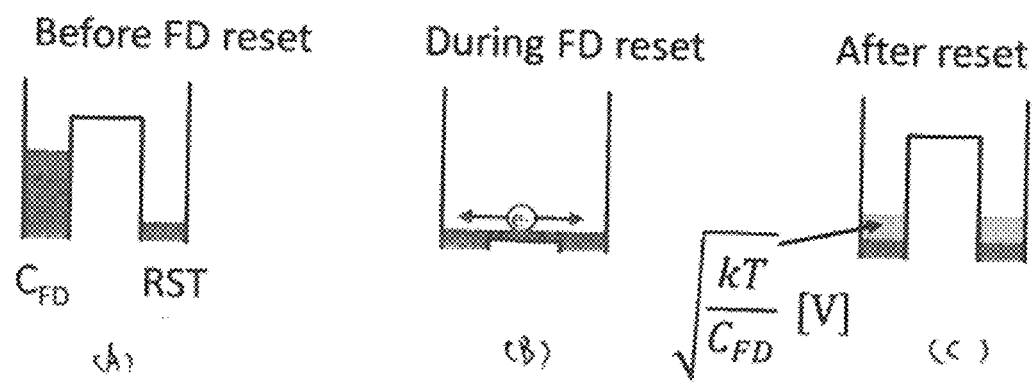
FIG. 5 shows, as a comparative example, how the potential transitions when the noise reduction is not performed on the floating diffusion in the conventional art or when the noise reducing part is not applied.

FIG. 4 includes views (A) to (D) showing how the potential transitions during noise reduction performed on the floating diffusion using the noise reducing part relating to the first embodiment of the present invention. FIG. 5 includes views (A) to (C) showing, as a comparative example, how the potential transitions when the noise reduction is not performed on the floating diffusion in the conventional art or when the noise reducing part is not applied.

The following more specifically describes the noise reduction. In the first reset operation including the noise reduction, under control of the reading part 70 and the noise reducing part 220, as shown in the views (A) and (B) in FIG. 4, the first and second reset transistors RST11-Tr and RST12-Tr are switched into the conduction state at the start of the reset period PR1, and the first reset line LRST1 is connected to the second reset line LRST2, which is connected to the capacitor CS11 and the to-be-reset floating diffusion FD11. In parallel, the first reset line LRST1 is connected to the power supply potential Vdd or the reset potential. In this manner, the floating diffusion FD11, which is the target to be reset, starts discharging the charges. The first reset line LRST1 remains connected to the power supply potential Vdd or the reset potential during the predetermined first period PR11 that starts when the reset period PR1 starts. In this manner, the charge discharging continues.

After the first period PR11 elapses, in order to increase the impedance of the first reset line LRST1, the second reset transistor RST12-Tr is switched into the non-conduction state as shown in the view (C) in FIG. 4, so that the first reset line LRST1 is switched into the floating state. This raises the impedance of the first reset line LRST1, as a result of which the reset kTC noise freezes on the first reset line LRST1.

In the comparative example, the kTC noise is high as represented by $\sqrt{(kT/CFD)}[V]$ after the resetting since it is affected by fluctuations and other factors, as shown in the view (C) in FIG. 5. In the first embodiment, on the other hand, after the second reset transistor RST12-Tr is switched to the non-conduction state, the kTC noise of the first reset line LRST1 is represented by $\sqrt{(kT/(CFD+CR))}[V]$ as shown in the view (C) in FIG. 4, which is lower due to the influence of the reset capacitor CR11. More specifically, it is inferred that the larger the capacitance CR, the smaller the kTC noise, since the capacitance CR of the reset capacitor CR11 is added on the denominator side in the square root of the expression.

After the second period PR12 elapses and the reset period PR1 ends, the first reset transistor RST11-Tr is brought into the non-conduction state. This results in separating the reset pixel from the other pixels in the same row. Because of the high impedance of the first reset line LRST1, the reset noise can be kept low as long as electrons do not move around in the first reset line LRST1.

For example, if CR=1 pF, the reset kTC noise is 64 µVrms at 1 sigma. In a conventional LOFIC with CS=10 fF, on the other hand, the reset kTC noise is 640 µVrms at 1 sigma. In other words, the present embodiment can reduce the drop in SNR to 1/10.

Figure 6:
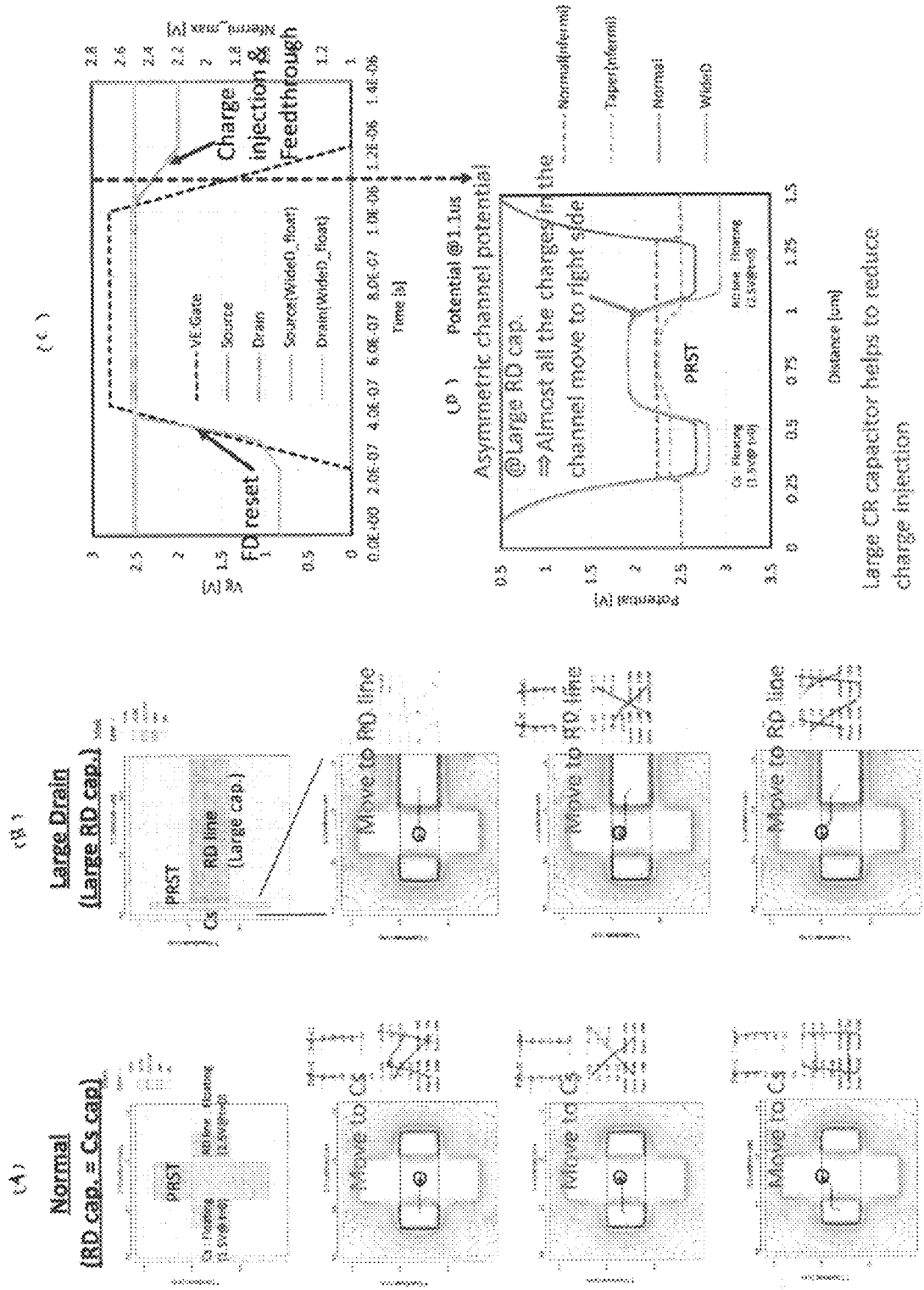
FIG. 6 shows a simulation of how charges move around a first reset transistor when resetting involving noise reduction is performed on the floating diffusion using the noise reducing part relating to the first embodiment of the present invention.

FIG. 6 includes views (A) to (D) showing a simulation of how the charges move around the first reset transistor when resetting involving noise reduction is performed on the floating diffusion using the noise reducing part relating to the first embodiment of the present invention. In FIG. 6, the view (A) shows, as a comparative example, how the charges move around the first reset transistor when conventional resetting is performed on the floating diffusion without using the noise reducing part.

Figure 7:
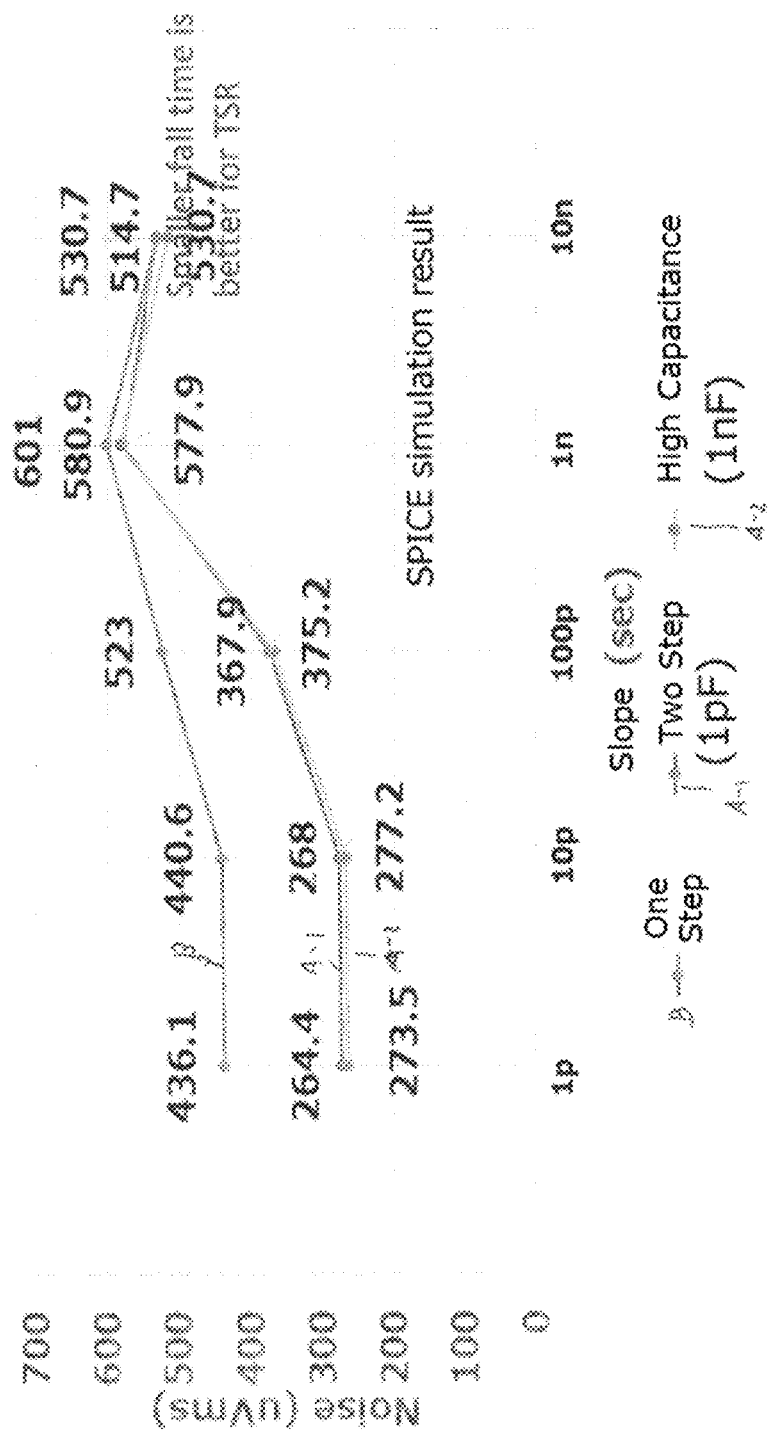
FIG. 7 shows a simulated relation between noise and a fall time of a first reset control signal applied to the first reset transistor when resetting involving noise reduction is performed on the floating diffusion using the noise reducing part relating to the first embodiment of the present invention.

FIG. 7 shows a simulated relation between the noise and the fall time of the first reset control signal PRG applied to the first reset transistor when resetting involving noise reduction is performed on the floating diffusion using the noise reducing part relating to the first embodiment of the present invention. In FIG. 7, the horizontal axis represents the fall time of the first reset control signal PRG, and the vertical axis represents the noise. In FIG. 7, the curve indicated by the letter "A" represents the fall time-noise characteristics of the present invention, and the curve indicated by the letter "B" represents the fall time-noise characteristics of the conventional product (comparative example).

When the first reset control signal PRG falls to bring the first reset transistor RST11-Tr into the non-conduction state (off), the electrons move due to clock feedthrough and charge injection, resulting in a larger than expected kTC noise at the time of resetting. Therefore, provided that the fall time of the first reset control signal PRG is shorter than the settling time of the charges injected into the storage capacitor CS11 and the floating diffusion FD11, the kTC noise at the time of resetting can be reduced by means of fast switching of the first reset transistor RST11-Tr.

For example, the fall time of the first reset control signal PRG can be reduced using a repeater buffer in the pixel array that is configured to generate the first reset control signal PRG.

When the high conversion gain (HCG) is used to read the pixel signal, the reset noise of the read-out reset signal VRL is the same as the reset noise of the read-out luminance signal VSL. Therefore, subtraction referred to as the correlated double sampling (CDS) can be effectively applied to eliminate the noise. Thus, in the present embodiment, when the signals produced with different conversion gains and having different signal directions are read, noise reduction is not performed during a reset period associated with reading of the first read-out reset signal HCGRST under control of the reading part 70 (this is referred to as a second reset operation).

The second reset operation, which does not include the noise reduction, is performed under control of the reading part 70 and the noise reducing part 220 in the following manner. When reset read-out is performed for the first time after exposure, the first reset transistor RST11-Tr remains in the non-conduction state, and the storage transistor SG11-Tr is switched to the non-conduction state, so that the storage capacitor CS11 is separated from the floating diffusion FD11. In this manner, the charges in the floating diffusion FD11 are separated from the charges in the storage capacitor CS11, so that the gain of the floating diffusion FD11 is set at the first conversion gain (HCG) corresponding to the first capacitance. The first conversion gain reset read-out operation is then performed.

Since the pixel part 20 includes the readable pixels 200 arranged in N rows and M columns, N control lines are provided for each of the control signals, and M vertical signal lines are provided. In FIG. 1, the control lines for each row are represented as one row-scanning control line.

The vertical scanning circuit 30 drives the pixels in shutter and read-out rows through the row-scanning control lines under control of the timing control circuit 60. Further, the vertical scanning circuit 30 outputs, according to address signals, row selection signals for row addresses of the reading rows from which signals are read out and the shutter rows in which the charges stored in the photodiodes PD11 are reset.

The reading circuit 40 includes a plurality of pixel signal processing parts, which are a plurality of column signal processing circuits (not shown) arranged corresponding to the column outputs of the pixel part 20, and the reading circuit 40 may be configured such that the plurality of column signal processing circuits can perform column parallel processing. In the reading circuit 40, the pixel signal processing parts are capable of inverting one of the first conversion gain signal (HCGRST, HCGSIG) and the second conversion gain signal (LCGSIG, LCGRST), which have opposite signal directions or opposite level transitioning directions and are read out as the pixel signal PXLOUT from the readable pixels 200, specifically, the first conversion gain signal.

The horizontal scanning circuit 50 scans the signals processed in the plurality of pixel signal processing parts of the reading circuit 40, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

When the dual conversion gain reading mode MDCG is designated, the reading part 70 performs a first conversion gain reset read-out operation HCGRRD, a first conversion gain read-out operation HCGRRD, a second conversion gain read-out operation LCGSRD, and a second conversion gain reset read-out operation LCGRRD.

In the first embodiment, the reading part 70 performs, after an exposure period PEXP starts, a read-out operation in the dual conversion gain read-out mode MDCG.

For example, the reading part 70 controls the first and second reset transistors RST11-Tr and RST12-Tr, the storage transistor SG11-Tr and the transfer transistor TG11-Tr to remain in the conduction state for a predetermined period of time, so that the photodiode PD11, the floating diffusion FD11 and the storage capacitor CS11 are reset to perform a shutter operation, and controls the transfer transistor TG11-Tr to remain in the non-conduction state to perform a first reset operation and start the exposure period PEXP, as shown in FIG. 3. After the exposure period PEXP starts, the reading part 70 operates in the dual conversion gain reading mode MD CG, specifically, sequentially performs a first conversion gain reset read-out operation HCGRRD, a first conversion gain read-out operation HCGSRD, a second conversion gain read-out operation LCGSRD, and a second conversion gain reset read-out operation LCGRRD.

<Read-Out Operation in Solid-State Imaging Device 10>

The above has described the characteristic configurations and functions of the parts of the solid-state imaging device 10. The following now describes how to read the pixel signal in the solid-state imaging device 10 relating to the first embodiment, with reference to the parts (A) to (E) in FIG. 3.

In FIG. 3, the part (A) shows the control signal TG for the transfer transistor TG11-Tr of the readable pixel 200, the part (B) shows the control signal SG for the storage transistor SG11-Tr of the readable pixel 200, the part (C) shows the control signal SEL for the selection transistor RSEL11-Tr of the readable pixel 200, the part (D) shows the control signal PRG for the first reset transistor RST11-Tr of the readable pixel 200, and the part (E) shows the control signal CRG for the second reset transistor RST12-Tr of the noise reducing part 220.

Before the dual conversion gain read-out mode MDCG starts, the control signals PRG, CRG, SG and TG remain at the high level for a predetermined period of time, to keep the first reset transistor RST11-Tr, the second reset transistor RST12-Tr, the storage transistor SG11-Tr, and the transfer transistor TG11-Tr in the conduction state for a predetermined period of time. This resets the photodiode PD11, the floating diffusion FD11 and the storage capacitor CS11 to the fixed potential Vdd. In other words, a shutter operation is performed (the parts (A) to (E) in FIG. 3).

<Read-Out Operation in First Conversion Gain Signal Read-Out Mode>

After the transfer transistor TG11-Tr is switched from the conduction state to the non-conduction state, a first reset operation is performed so that an exposure period PEXP starts, and a read-out operation is performed in the first conversion gain signal read-out mode. After a certain period of time elapses since the start of the exposure period PEXP, the control signal SG is switched to and remains at the high level for a predetermined period of time. After this, the control signal SG is switched to the low level and the control signal SEL is switched to the high level, so that a first read-out reset signal (HCGRST) starts to be read out. Since the control signal SG remains at the low level to keep the storage transistor SG11-Tr in the non-conduction state, the charges in the floating diffusion FD11 and the charges in the storage capacitor CS11 are separated from each other, so that the gain of the floating diffusion FD11 remains at the first conversion gain HCG corresponding to the first capacitance including the capacitance CFD of the floating diffusion FD11.

In a first reset signal read-out period following the reset operation, the first conversion gain reset read-out operation HCGRRD is performed. Specifically, a first read-out reset signal HCGRST, which is produced through conversion with the first conversion gain HCG corresponding to the first capacitance of the floating diffusion FD11, is read from the source follower transistor SF11-Tr to the vertical signal line LSGN11 and processed in a predetermined manner in the reading circuit 40 serving as a column processing circuit.

The first reset signal read-out period is followed by a first transfer period, in which the control signal TG is switched to the high level to keep the transfer transistor TG11-Tr in the conduction state, so that the charges stored in the photodiode PD11 are transferred to the floating diffusion FD11. After the first transfer period, the control signal TG is switched to the low level to switch the transfer transistor TG11-Tr into the non-conduction state.

The first transfer period is followed by a first signal read-out period, the first conversion gain read-out operation HCGSRD is performed. Specifically, a first read-out signal HCGSIG, which is produced through conversion with the first conversion gain corresponding to the first capacitance of the floating diffusion FD11, is read from the source follower transistor SF11-Tr to the vertical signal line LSGN11 and processed in a predetermined manner in the reading circuit 40 serving as the column processing circuit.

The reset level (VHCGRST, VRH) and the signal level (VHCGSIG, $V_{SH}$) are held, or a digital CDS operation is performed based on the difference between the reset level and the signal level.

<Read-Out Operation in Second Conversion Gain Signal Read-Out Mode>

After the first conversion gain read-out operation HCGSRD, the control signal SG is switched from the low level to the high level, to place the storage transistor SG11-Tr into the conduction state and to connect the storage capacitor CS11 to the floating diffusion FD11. In this way, the charges in the floating diffusion FD11 and the charges in the storage capacitor CS11 are combined, so that the gain of the floating diffusion FD11 is switched to the second conversion gain LCG corresponding to the second capacitance. In this manner, the first conversion gain signal read-out mode ends and the second conversion gain signal read-out mode starts.

The first signal read-out period is followed by a second transfer period, in which the control signal TG is switched to the high level to keep the transfer transistor TG11-Tr in the conduction state, so that the charges stored in the photodiode PD11 are transferred to the floating diffusion FD11. After the second transfer period, the control signal TG is switched to the low level to switch the transfer transistor TG11-Tr into the non-conduction state. The first signal read-out period is followed by the second transfer period and then a second signal read-out period, in which the second conversion gain read-out operation LCGSRD is performed. Specifically, a second read-out signal LCGSIG, which is produced through conversion with the second conversion gain LCG corresponding to the second capacitance of the floating diffusion FD11, is read from the source follower transistor SF11-Tr to the vertical signal line LSGN11 and processed in a predetermined manner in the reading circuit 40 serving as the column processing circuit.

After the second signal read-out period has elapsed, a reset period PR1 starts with the first reset transistor RST11-Tr and the second reset transistor RST12-Tr being switched to the conduction state, so that the second reset line LRST2, to which the to-be-reset floating diffusion FD11 is connected, is connected to the first reset line LRST1, and the first reset line LRST1 is also connected to the power supply potential Vdd, which is the reset potential. In this manner, the to-be-reset floating diffusion FD11 starts discharging the charges. The first reset line LRST1 remains connected to the reset potential during a predetermined first period PR11 that starts when the reset period PR1 starts. After the first period PR11 elapses, the second reset transistor RST12-Tr is switched into the non-conduction state, so that the first reset line LRST1 is switched into the floating state. In this manner, the first reset line LRST1 has high impedance. After a second period PR12 elapses and the reset period PR1 ends, the first reset transistor RST11-Tr is brought into the non-conduction state. After the first reset operation is performed to reset the floating diffusion FD11, a second reset signal read-out period starts. In a second reset signal read-out period, a second conversion gain reset read-out operation LCGRRD is performed. Specifically, a second read-out reset signal LCGRST, which is produced through conversion with the second conversion gain LCG corresponding to the second capacitance of the floating diffusion FD11, is read from the source follower transistor SF11-Tr to the vertical signal line LSGN11 and processed in a predetermined manner in the reading circuit 40 serving as the column processing circuit.

The reset level (LCGRST, VRL) and the signal level (LCGSIG, $V_{SL}$) are held, or an offset noise cancel operation is performed based on the difference between the reset level LCGRST (VRL) and the signal level LCGSIG ($V_{SL}$).

As described above, in the first embodiment, the first reset operation involves noise reduction. Under control of the reading part 70 and the noise reducing part 220, the first reset transistor RST11-Tr and the second reset transistor RST12-Tr are switched into the conduction state at the start of the reset period PR1, so that the second reset line LRST2, to which the target to be reset is connected, is connected to the first reset line LRST1. In addition, the first reset line LRST1 is connected to the power supply potential Vdd, which is the reset potential, so that the to-be-reset target starts discharging the charges. The first reset line LRST1 remains connected to the reset potential during the predetermined first period PR11 that starts when the reset period PR1 starts. After the first period PR1 elapses, the second reset transistor RST12-Tr is switched into the non-conduction state, so that the first reset line LRST1 is switched into the floating state. In this manner, the first reset line LRST1 has high impedance. After the second period PR12 elapses and the reset period PR1 ends, the first reset transistor RST11-Tr is brought into the non-conduction state.

With the above-described configuration, the first embodiment is capable of reading signals produced with different conversion gains and having different signal directions while reducing kTC noise of the low conversion gain (LCG) signal, preventing a drop in SNR at the conjunction point of the high conversion gain (HCG) signal and the low conversion gain (LCG) signal and eventually achieving improved image quality.

Second Embodiment

Figure 8:
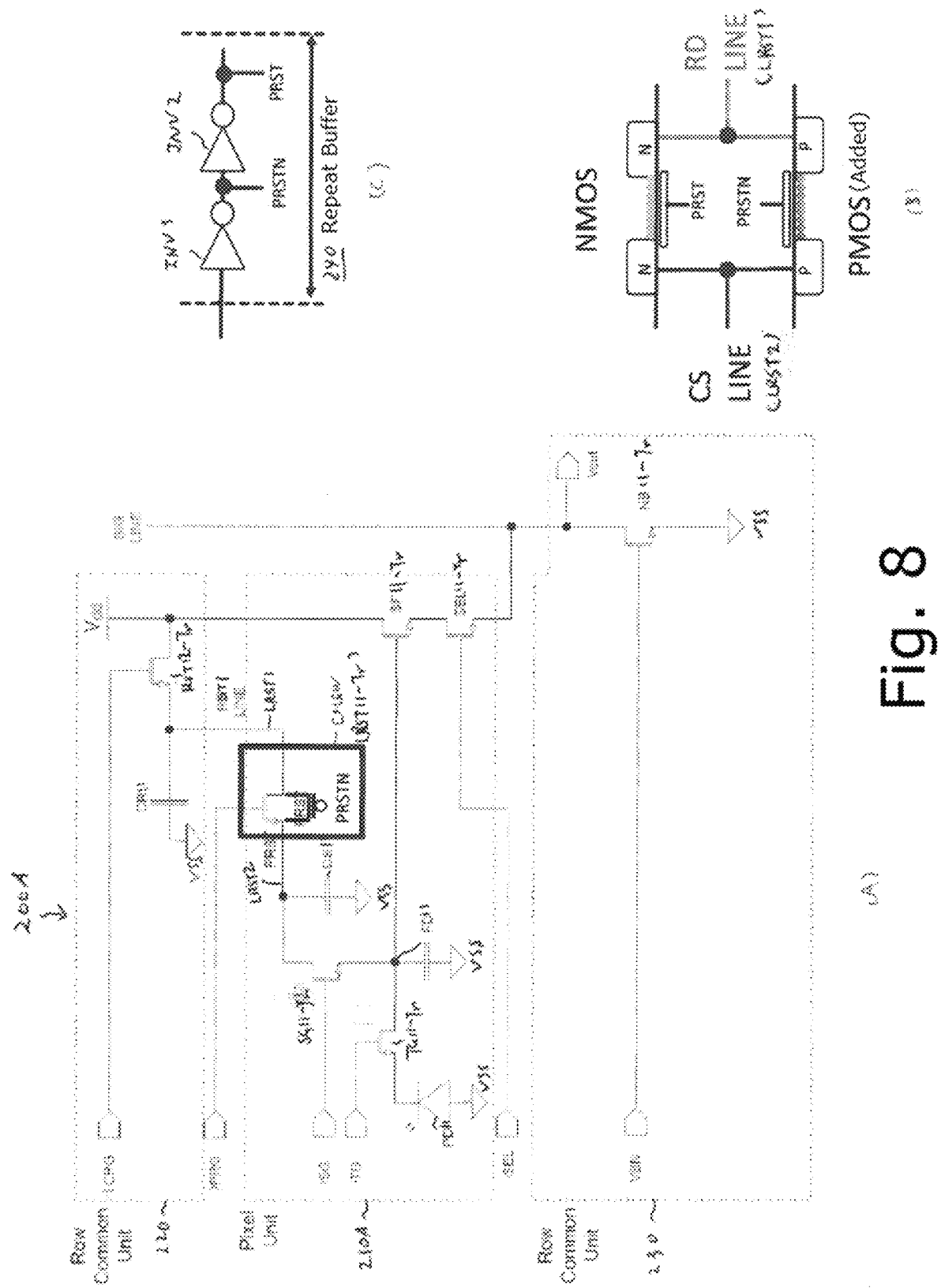
FIG. 8 shows an example configuration of a readable pixel and a noise reducing part in a solid-state imaging device relating to a second embodiment of the present invention.

FIG. 8 includes views (A) to (C) showing an example configuration of a readable pixel and a noise reducing part of a solid-state imaging device relating to a second embodiment of the present invention. In FIG. 8, the view (A) shows a circuit diagram showing the example configuration of the readable pixel and the noise reducing part in the solid-state imaging device relating to the second embodiment, the view (B) shows an example device structure of the CMOS switch, and the view (C) shows a circuit diagram showing an example configuration of the repeat buffer.

The pixel 200A of the solid-state imaging device relating to the second embodiment differs from the pixel 200 of the first embodiment in the following points.

In the readable pixel 200 relating to the first embodiment, the first reset transistor RST11-Tr is formed by an NMOS transistor.

In the readable pixel 200A relating to the second embodiment, on the other hand, the first reset transistor RST11-Tr is formed by a CMOS switch CMSW including an NMOS and a PMOS, where their sources are connected to each other and so are their drains.

In the CMOS switch CMSW, a control signal PRST and a control signal PRSTN are respectively applied to the NMOS gate and the PMOS gate, where the levels of the control signals PRST and PRSTN are complementary to each other. The control signals PRST and PRSTN, which have complementary levels, can be configured using the repeat buffer 240 as shown in the view (C) in FIG. 8.

The repeat buffer 240 is constituted by, for example, two inverters INV1 and INV2 connected in series. A reference input signal is inverted in level at the first-stage inverter INV1 to produce the control signal PRSTN, which is fed to the gate of the PMOS. The control signal PRSTN is inverted in level at the next-stage inverter INV2 to produce the control signal PRST, which is fed to the gate of the NMOS.

The above-described second embodiment can not only produce the same effects as the first embodiment but also reduce the feedthrough. Since the first reset transistor RST11-Tr is formed by a CMOS switch CMSW having an NMOS and a PMOS the sources of which are connected and the drains of which are connected, the NMOS and PMOS operate in reversed manners to eventually cancel the feedthrough.

Third Embodiment

Figure 9:
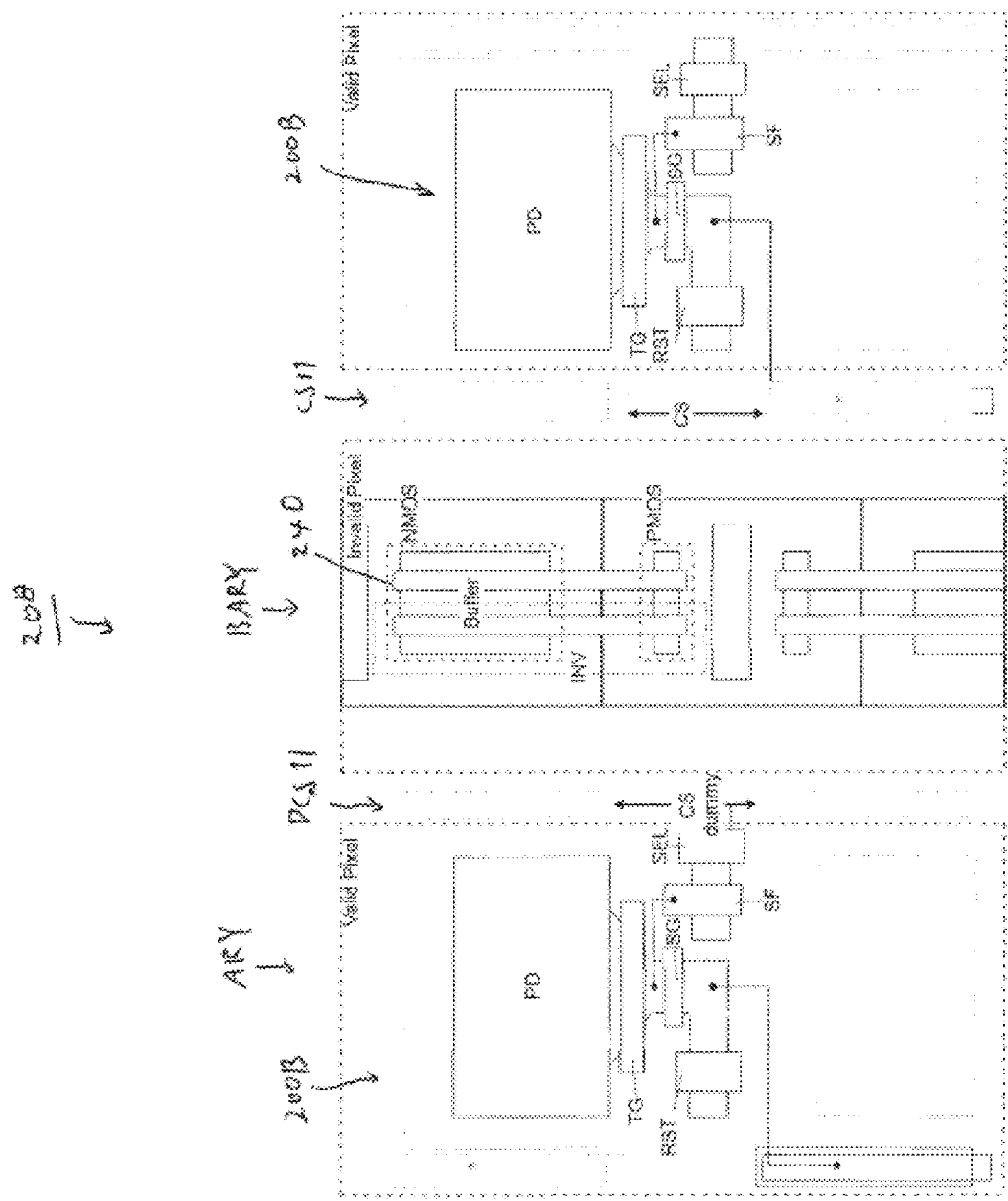
FIG. 9 shows an example configuration of a pixel array in a pixel part relating to a third embodiment of the present invention.

FIG. 9 shows an example configuration of an array of pixels in a pixel part relating to a third embodiment of the present invention.

A pixel part 20B of the third embodiment differs from the pixel part 20A of the second embodiment in the following points.

In the pixel part 20A of the second embodiment, the first reset transistor RST11-Tr is formed by a CMOS switch CMSW, so that the NMOS and PMOS can operate in reversed manners to cancel the feedthrough. As a result, the feedthrough can be reduced. The photodiode PD11 arranged in each pixel, however, needs to be protected against interference noise, which may be caused by the repeater buffer 240 in the pixel array.

To overcome this issue, the pixel part 20B relating to the third embodiment provides for a pixel array ARY configured to be capable of protecting the photodiode PD11 against the interference noise caused by the repeater buffer 240 in the pixel array ARY. In the pixel 200B relating to the third embodiment, the photodiode PD and the storage capacitor CS11 are arranged side by side in one direction (the x-direction in this example), and the pixel part 20B relating to the third embodiment includes a pixel array ARY and a buffer array BARY. In the pixel array ARY, the pixels 200B are arranged. In the buffer array BARY, repeater buffers 240 are arranged. Each repeater buffer 240 is configured to generate a control signal to drive the first reset transistor RST11-Tr and positioned between the pixels 200B constituting the pixel array ARY. Each repeater buffer 240 is adjacent to the storage capacitor CS11 of the adjacent pixel on one side (e.g., the right side) in the one direction (the x direction), and a dummy storage capacitor DCS11 is positioned between the repeater buffer 240 and the photodiode PD of the adjacent pixel on the other side (e.g., the left side) in the one direction.

Specifically, as shown in FIG. 9, the photodiode PD on the left side of the repeat buffer 240 is protected by the CS of the pixel, while the photodiode PD on the right side is protected by the dummy storage capacitor DCS. The interference noise can be absorbed by the active area CS and the CS dummy bias. The CS dummy can be also used to maintain uniform layout boundary conditions for the PDs and avoid degradation in pixel response non-uniformity (PRNU).

The third embodiment can not only produce the same effects as the first and second embodiments described above but also protect the photodiode PD11 against the interference noise caused by the repeater buffer 240 in the pixel array ARY.

Fourth Embodiment

Figure 10:
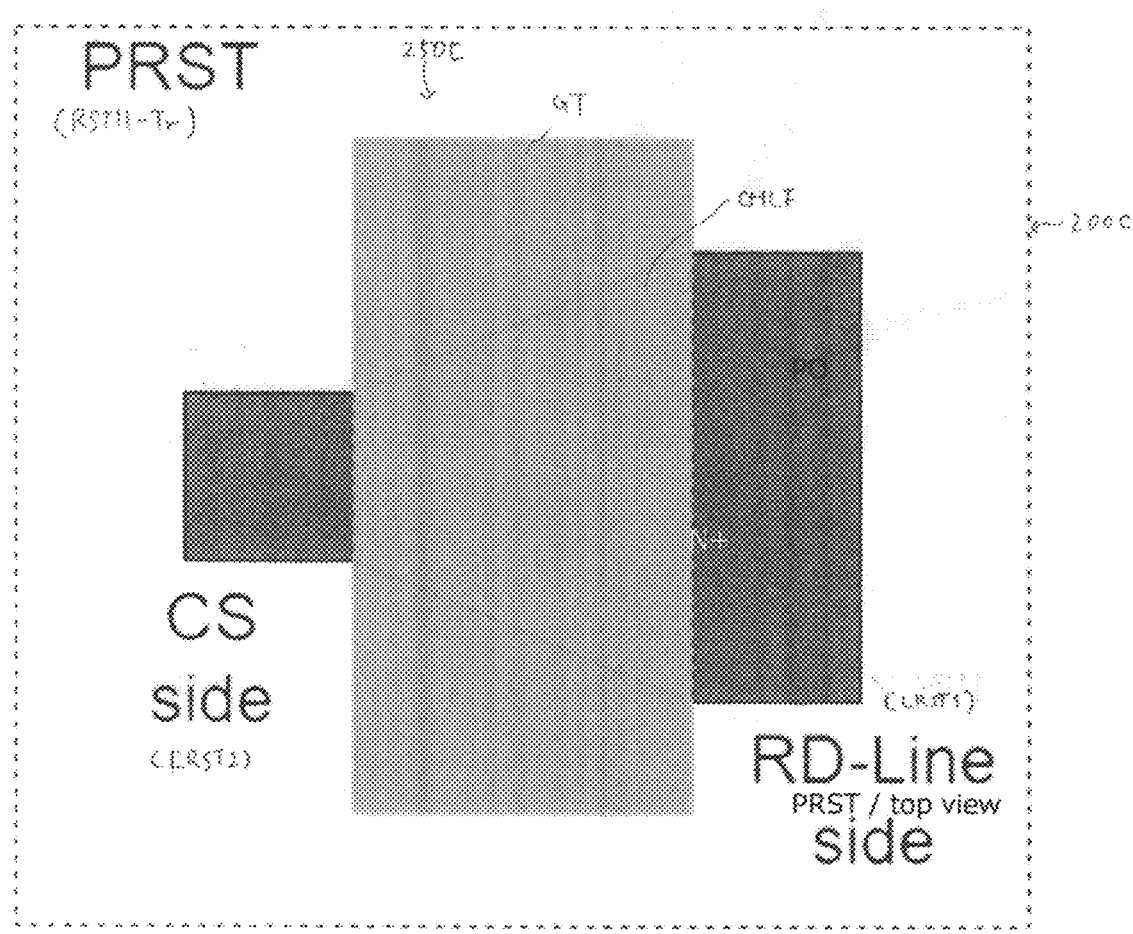
FIG. 10 is used to illustrate a preferable example configuration of a channel formation region in a first reset transistor constituting a pixel relating to a fourth embodiment of the present invention.
Figure 11:
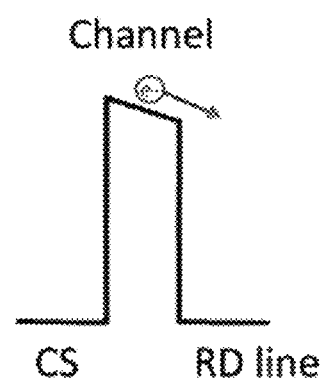
FIG. 11 shows that, when the first reset transistor has high impedance on the storage capacitor CS side, the channel charges do not move to the CS but to the first reset line LRST1.
Figure 12:
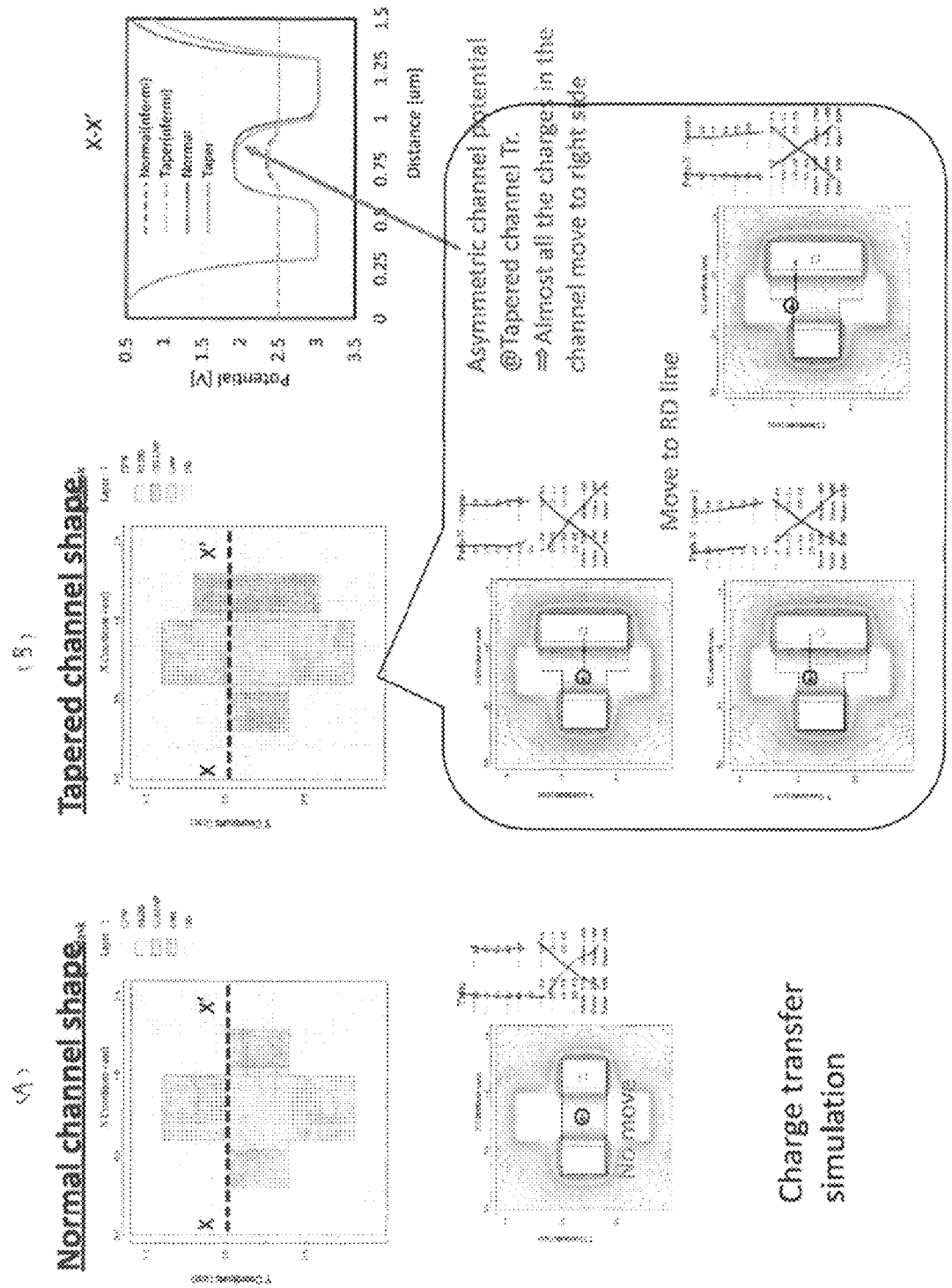
FIG. 12 shows a simulation of how charges move around the first reset transistor when resetting involving noise reduction is performed on the floating diffusion using the noise reducing part relating to the fourth embodiment of the present invention.

FIG. 10 is used to illustrate a preferable example configuration of a channel formation region in a first reset transistor constituting a pixel relating to a fourth embodiment of the present invention. FIG. 11 shows that, when the first reset transistor has high impedance on the storage capacitor CS side, the channel charges do not move to the CS side but to the first reset line LRST1. FIG. 12 includes the views (A) and (B) showing a simulation of how charges move around the first reset transistor when resetting involving noise reduction is performed on the floating diffusion using the noise reducing part relating to the fourth embodiment of the present invention. In FIG. 12, the view (A) shows, as a comparative example, how the charges move around the first reset transistor when conventional resetting is performed on the floating diffusion without using the noise reducing part.

A pixel 200C of the fourth embodiment differs from the pixel 200 of the first embodiment in the following points. In the pixel 200C relating to the fourth embodiment, the first reset transistor RST11-Tr is formed by a field effect transistor 250C, where first and second terminals serve as a source-drain diffusion layer, a channel formation region CNLF is formed between the first and second terminals, and a gate electrode GT is arranged on the channel formation region CNLF with an insulator therebetween. The first reset transistor RST11-Tr is characterized in that the active region on the first terminal side is larger than the active region on the second terminal side, and the channel formation region CNLF is shaped such that its width is larger on the first terminal (drain) side than on the second terminal (source) side, or it is tapered, for example.

According to the fourth embodiment, the active area on the first reset line LRST1 side, which is larger than the active area on the storage capacitor CS11 side, is used for the first reset transistor RST11-Tr. Since the channel resistance is lower on the first reset line LRST1 side than on the storage capacitor CS side, the charges injected when the first reset transistor RST11-Tr is turned off are less likely to flow toward the CS. This can result in reducing the reset noise of the storage capacitor CS11 and the floating diffusion FD11.

Fifth Embodiment

Figure 13:
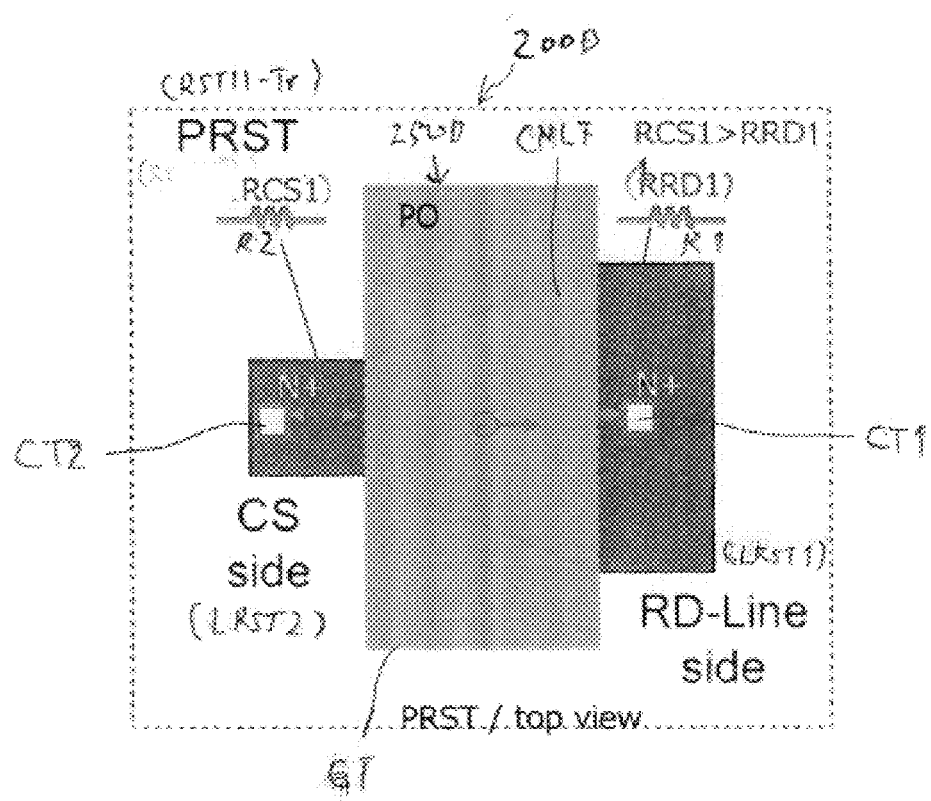
FIG. 13 is used to illustrate a preferable example configuration of a channel formation region and its surrounding region in a first reset transistor constituting a pixel relating to a fifth embodiment of the present invention.

FIG. 13 is used to illustrate a preferable example configuration of a channel formation region and its surrounding region in a first reset transistor constituting a pixel relating to a fifth embodiment of the present invention.

A pixel 200D of the fifth embodiment differs from the pixel 200C of the fourth embodiment in the following points. In the pixel 200D relating to the fifth embodiment, the first and second terminals of a field effect transistor 250D respectively have a first contact terminal CT1 and a second contact terminal CT22 for electrical connection with other layers. A first resistance R1 between the first contact terminal CT1 and under the gate electrode GT is less than a second resistance R2 between the second contact terminal CT2 and under the gate electrode GT.

In the fifth embodiment, the contact terminals CT1 and CT2 are asymmetrically positioned to create a difference in resistance. Since the first contact terminal CT1 on the first reset line LRST1 side is placed as close to the gate electrode GT as possible, the distance between them can be reduced in the N+ area where the electrons move, thereby lowering the resistance (R1). On the other hand, the second contact terminal CT2 on the CS side is placed as far from the gate as possible, so that the distance between them can be increased in the N+ area where the electrons move, thereby raising the resistance (R2). Thus, the electrons are more likely to move toward the first reset line LRST1.

Sixth Embodiment

Figure 14:
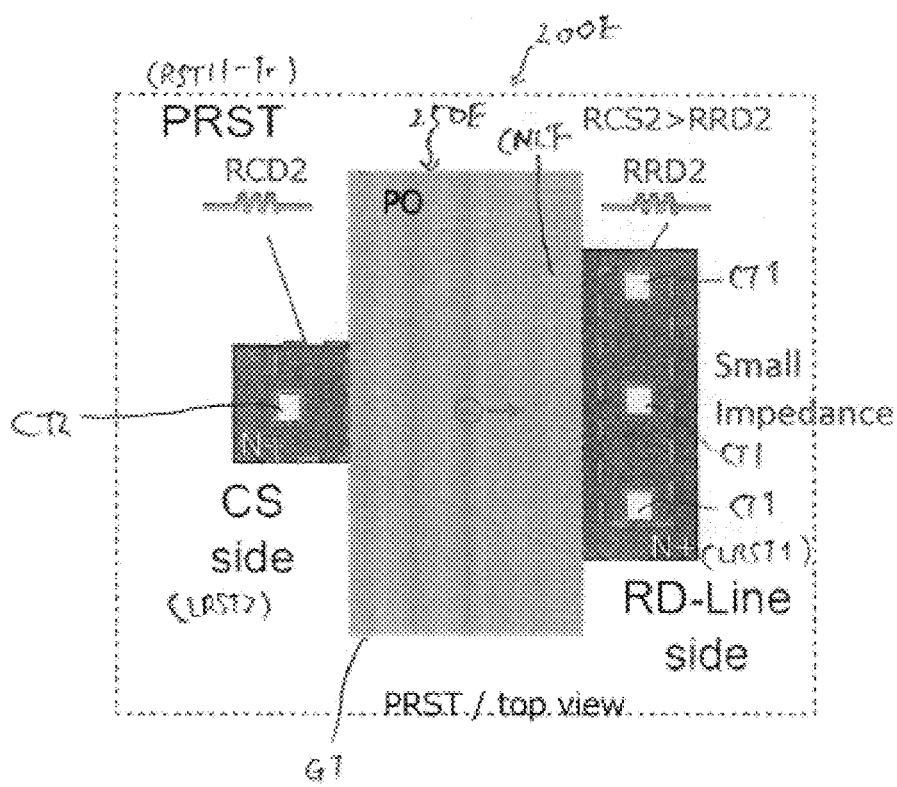
FIG. 14 is used to illustrate a preferable example configuration of a channel formation region and its surrounding region in a first reset transistor constituting a pixel relating to a sixth embodiment of the present invention.

FIG. 14 is used to illustrate a preferable example configuration of a channel formation region and its surrounding region in a first reset transistor constituting a pixel relating to a sixth embodiment of the present invention.

A pixel 200E of the sixth embodiment differs from the pixel 200D of the fifth embodiment in the following points. In the pixel 200E relating to the sixth embodiment, a field effect transistor 250E has a first terminal (drain) and a second terminal (source), with first contact terminals CT1 being arranged at the first terminal and second contact terminals CT2 being arranged at the second terminal. There are more first contact terminals CT1 than the second contact terminals CT2.

According to the sixth embodiment, more contact terminals CT1 are arranged on the first reset line LRST1 side, so that the impedance on the right side in the drawing (on the first reset line LRST1 side) is low. In addition, more than one contact terminals is arranged on the first reset line LRST1 side, so that the combined resistance can be lowered and the resistance on the right side is reduced. Thus, the electrons are more likely to move toward the first reset line LRST1.

Seventh Embodiment

Figure 15:
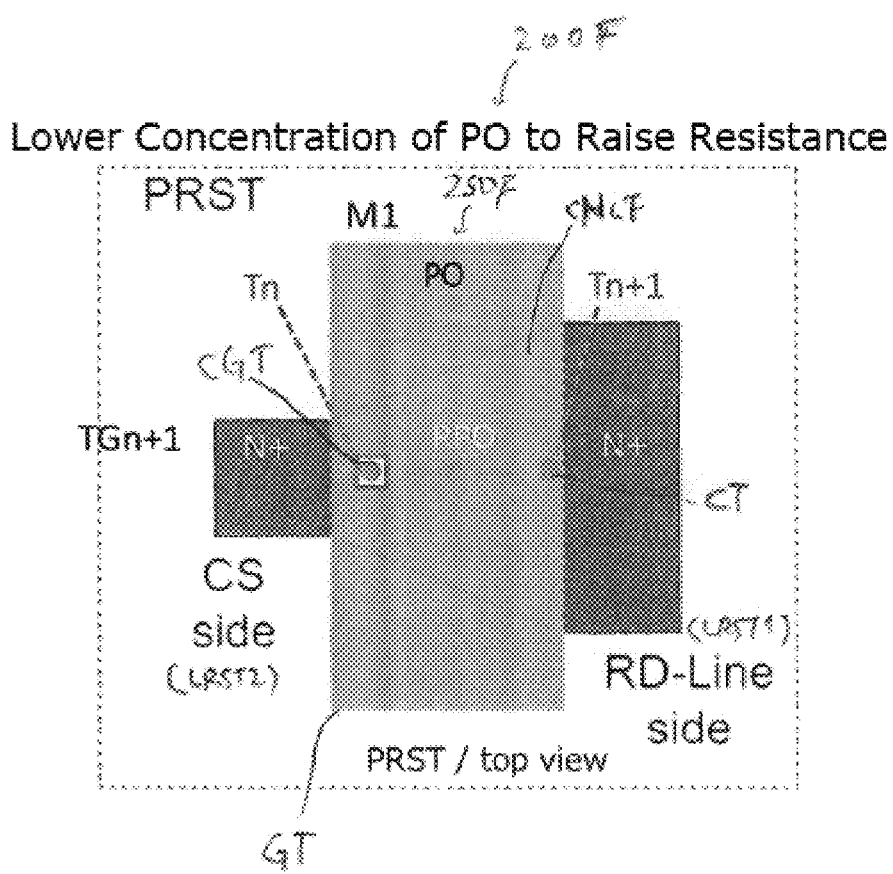
FIG. 15 is used to illustrate a preferable example configuration of a channel formation region and its surrounding region in a first reset transistor constituting a pixel relating to a seventh embodiment of the present invention.
Figure 16:
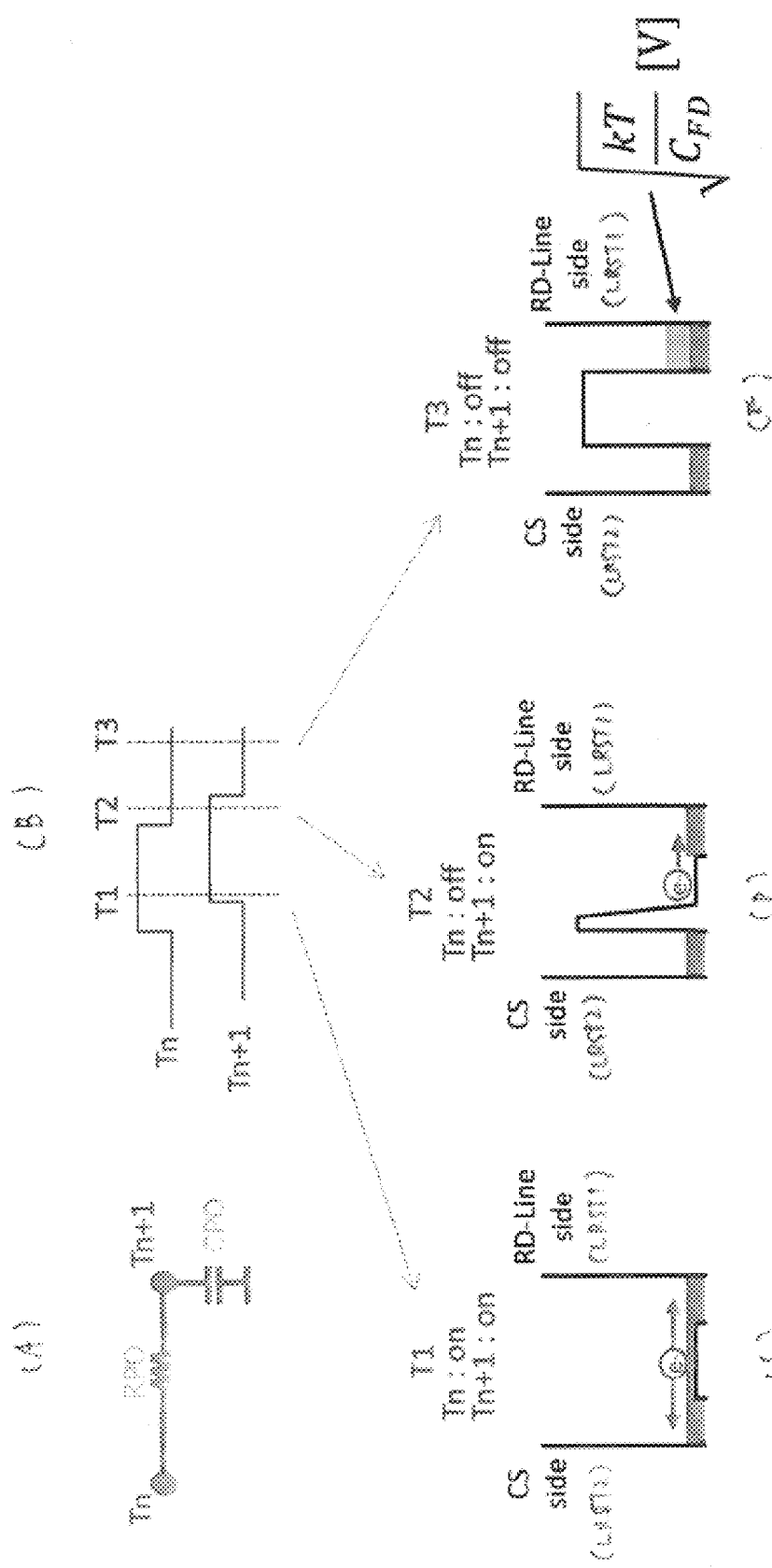
FIG. 16 shows an equivalent circuit of the main part of the pixel shown in FIG. 15, the timings of the operations, and how the charges move.

FIG. 15 is used to illustrate a preferable example configuration of a channel formation region and its surrounding region in a first reset transistor constituting a pixel relating to a seventh embodiment of the present invention. FIG. 16 includes views (A) to (E) to show an equivalent circuit of the main part of the pixel shown in FIG. 15, the timings of the operations, and how the charges move.

A pixel 200F relating to the seventh embodiment differs from the pixel 200D relating to the fifth embodiment in terms of the following. In the pixel 200F relating to the seventh embodiment, a field effect transistor 250F has a gate electrode made of polysilicon (PO) and has contact terminals. One of the contact terminals (the contact terminal CGT) for establishing electrical connection with another layer is closer to the second terminal (source), and the other contact terminal CT is closer to the first terminal (drain). The resistance RPO of the gate electrode GT between the contact terminal CGT for the gate electrode on the second terminal (source) side and the contact terminal CT for the gate electrode on the first terminal (drain) side is used to make a difference between the turn-off times of the pulse-shaped reset control signals applied to the contact terminals. In this manner, the charges are guided to move from the second terminal (source) side to the first terminal (drain) side.

According to the seventh embodiment, the contact terminal for the gate electrode GT made of PO is placed as close to the CS as possible, and the PO resistance is used to make a difference in turn-off time between the signals Tn and Tn+1. In this manner, the electrons are likely to move toward the first reset line LRST1.

Eighth Embodiment

Figure 17:
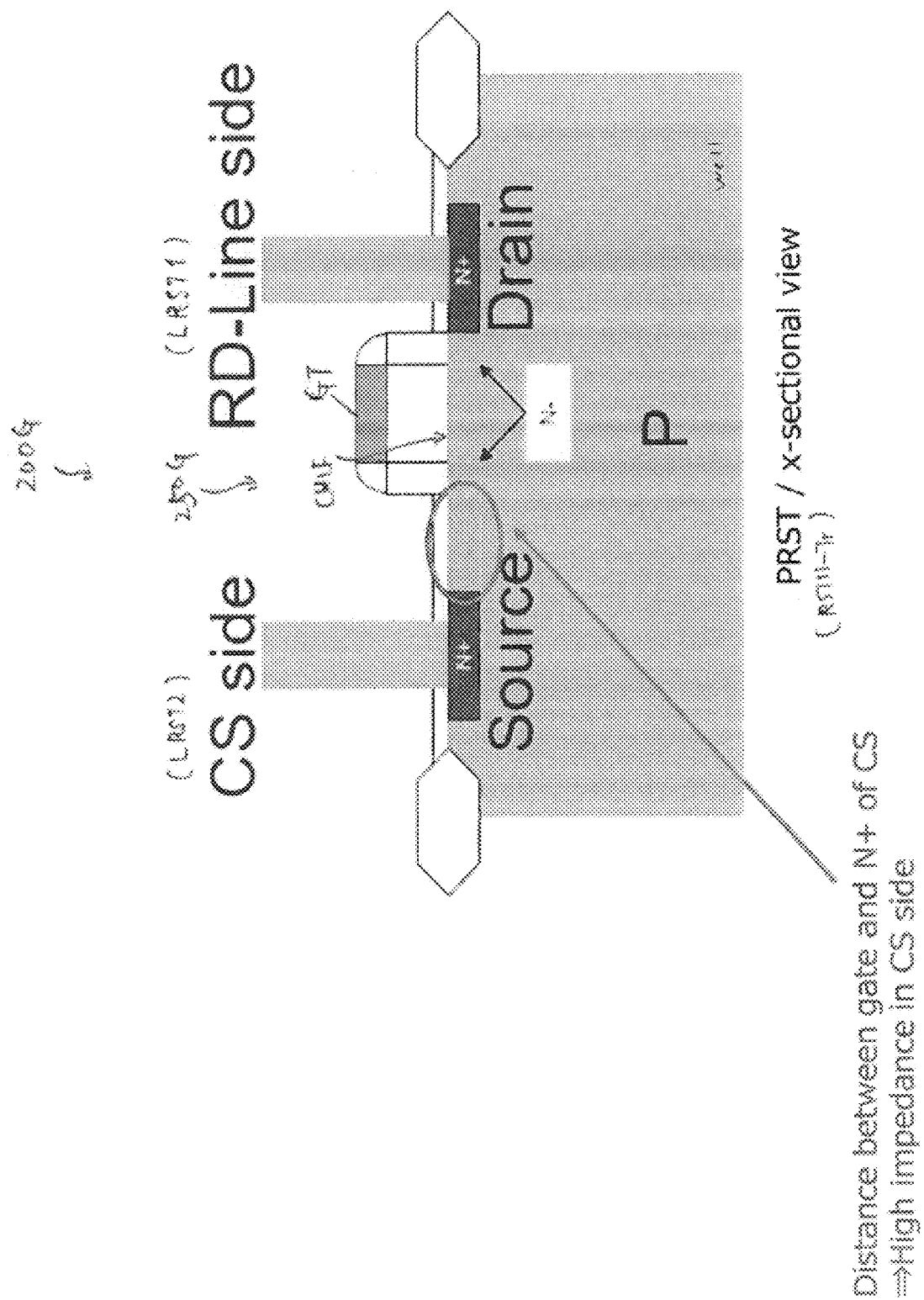
FIG. 17 is a simplified sectional view to illustrate a preferable example configuration of a first reset transistor constituting a pixel relating to an eighth embodiment of the present invention.

FIG. 17 is a simplified sectional view to illustrate a preferable example configuration of a first reset transistor constituting a pixel relating to an eighth embodiment of the present invention.

A pixel 200G of the eighth embodiment differs from the pixel 200 of the first embodiment in the following points. In the pixel 200G relating to the eighth embodiment, the first reset transistor RST11-Tr is formed by a field effect transistor 250G, where first and second terminals serve as a source-drain diffusion layer, a channel formation region CNLF is formed between the first and second terminals, and a gate electrode GT is arranged on the channel formation region CNLF with an insulator therebetween. The impedance in the channel formation region CNLF between the second terminal (source) and under the gate electrode GT is greater than the impedance in the channel formation region between the first terminal (drain) and under the gate electrode GT.

According to the eighth embodiment, the N+ region on the CS side is positioned according to the distance from the gate electrode GT. Since the resistance is lower on the first reset line LRST1 side than on the storage capacitor CS side, the charges injected when the first reset transistor RST11-Tr is turned off are less likely to flow into the CS side. This can result in reducing the reset noise of the storage capacitor CS and the floating diffusion FD11.

Ninth Embodiment

Figure 18:
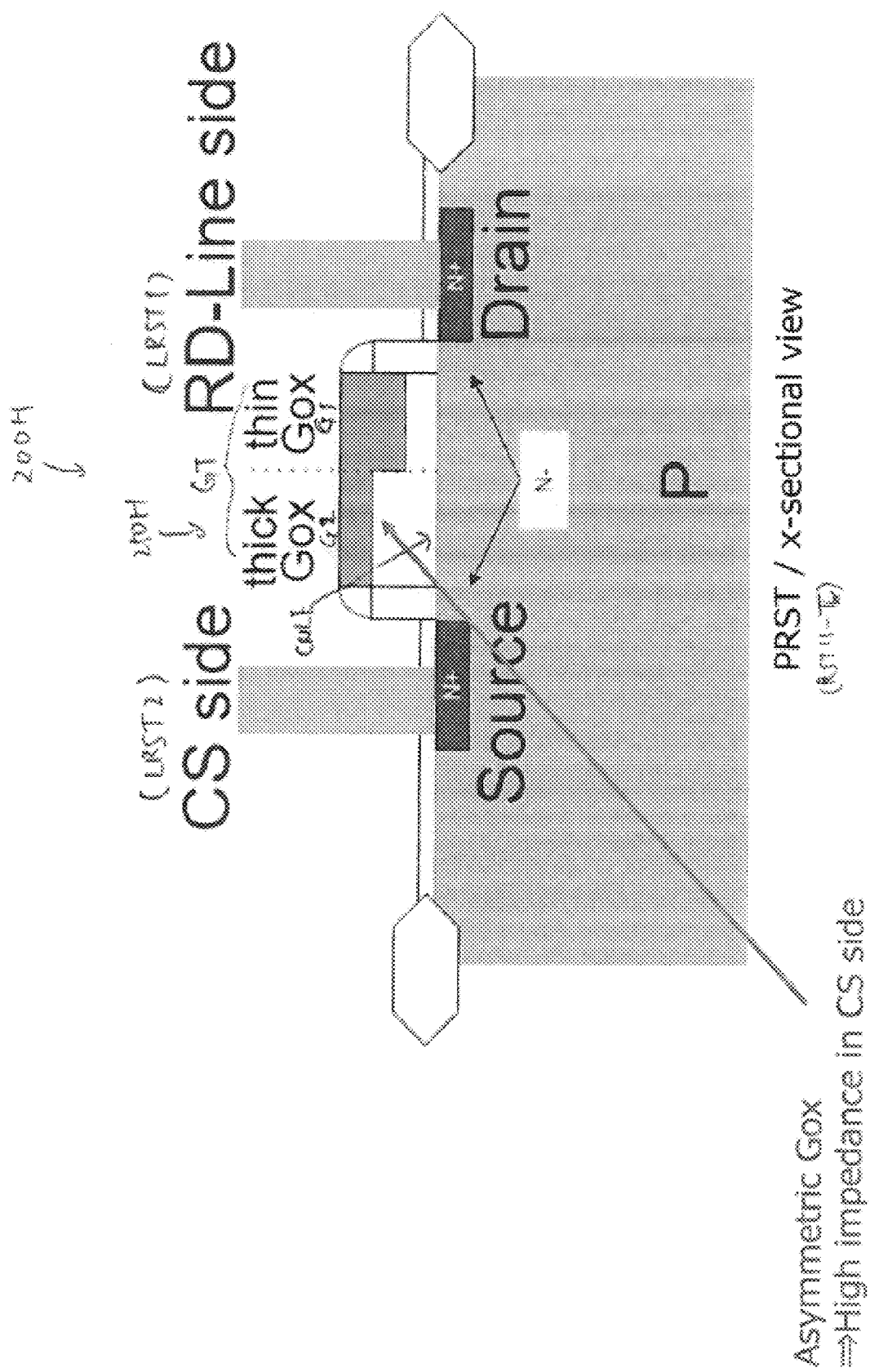
FIG. 18 is a simplified sectional view to illustrate a preferable example configuration of a first reset transistor constituting a pixel relating to a ninth embodiment of the present invention.

FIG. 18 is a simplified sectional view to illustrate a preferable example configuration of a first reset transistor constituting a pixel relating to a ninth embodiment of the present invention.

A pixel 200H of the ninth embodiment differs from the pixel 200 of the first embodiment in the following points. In the pixel 200H relating to the ninth embodiment, the first reset transistor RST11-Tr is formed by a field effect transistor 250H, where first and second terminals serve as a source-drain diffusion layer, a channel formation region CNLF is formed between the first and second terminals, and a gate electrode GT is arranged on the channel formation region CNLF with an insulator therebetween. The thickness G2 of the gate insulator Gox closer to the second terminal (source) is greater than the thickness G1 of the gate insulator Gox closer to the first terminal (drain).

According to the ninth embodiment, a thicker gate oxide is deposited on the CS side than on the first reset line LRST1 side. Since a small gate capacitance is present under a thin oxide, the charges injected when the first reset transistor RST11-Tr is turned off may flow into the LRST1 side. In addition, since a low channel conductance is exhibited under the thick oxide, the injected charges are less likely to flow into the CS side. This can result in reducing the reset noise of the storage capacitor CS11 and the floating diffusion FD11.

Tenth Embodiment

Figure 19:
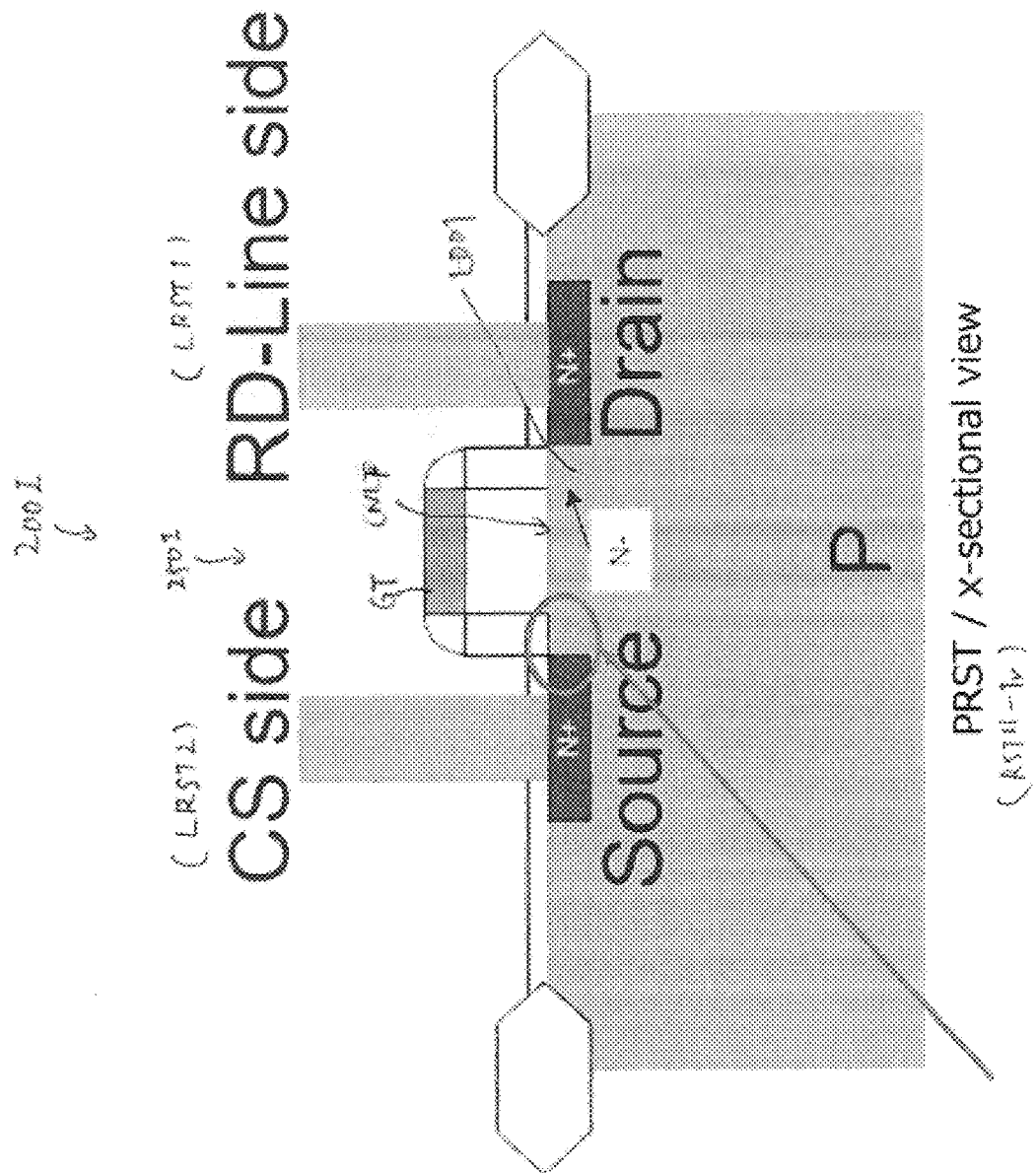
FIG. 19 is a simplified sectional view to illustrate a preferable example configuration of a first reset transistor constituting a pixel relating to a tenth embodiment of the present invention.

FIG. 19 is a simplified sectional view to illustrate a preferable example configuration of a first reset transistor constituting a pixel relating to a tenth embodiment of the present invention.

A pixel 200I of the tenth embodiment differs from the pixel 200 of the first embodiment in the following points. In the pixel 200I relating to the tenth embodiment, the first reset transistor RST11-Tr is formed by a field effect transistor 250I, where first and second terminals serve as a source-drain diffusion layer, a channel formation region CNLF is formed between the first and second terminals, and a gate electrode GT is arranged on the channel formation region CNLF with an insulator therebetween. A low-concentration impurity layer LDD1 is formed only on the first terminal (drain), from among the first and second terminals. The impurity layer LDD1 is contiguous to the first terminal.

According to the tenth embodiment, the LDD is buried only on the first reset line LRST1 side. Since the impedance on the CS side is higher than the potential on the first reset line LRST1 side, the charges injected when the first reset transistor RST11-Tr is turned off are less likely to flow into the CS side. This can result in reducing the reset noise of the storage capacitor CS11 and the floating diffusion FD11.

Eleventh Embodiment

Figure 20:
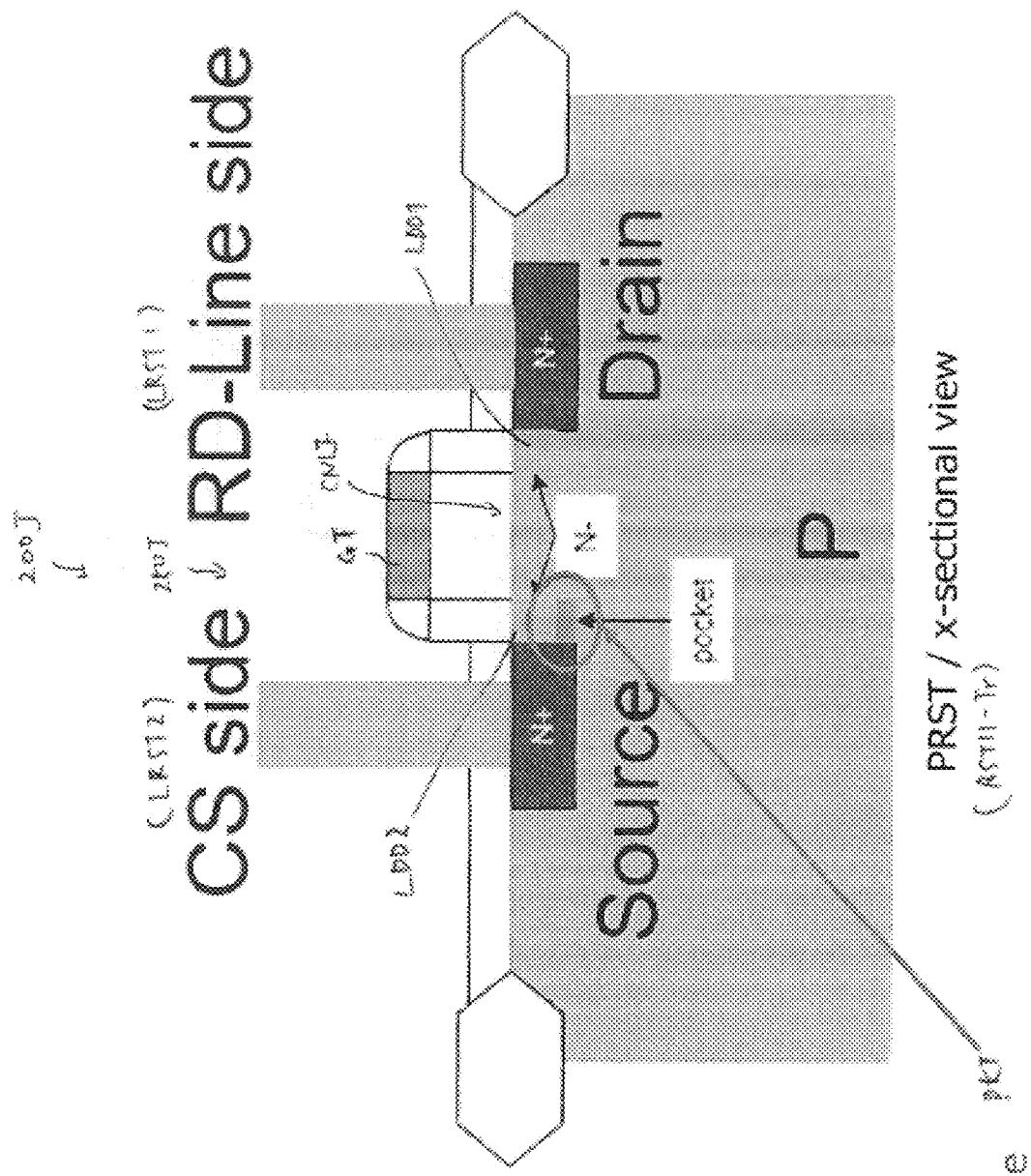
FIG. 20 is a simplified sectional view to illustrate a preferable example configuration of a first reset transistor constituting a pixel relating to an eleventh embodiment of the present invention.

FIG. 20 is a simplified sectional view to illustrate a preferable example configuration of a first reset transistor constituting a pixel relating to an eleventh embodiment of the present invention.

A pixel 200J of the eleventh embodiment differs from the pixel 200 of the first embodiment in the following points. In the pixel 200J relating to the eleventh embodiment, the first reset transistor RST11-Tr is formed by a field effect transistor 250J, where first and second terminals serve as a source-drain diffusion layer, a channel formation region CNLF is formed between the first and second terminals, and a gate electrode GT is arranged on the channel formation region CNLF with an insulator therebetween. Low-concentration impurity layers LDD1 and LDD2 are formed and contiguous to the first and second terminals, respectively. The low-concentration impurity layer LDD2 on the second terminal (source) side is contiguous to a pocket layer PKT having higher impurity concentration than the well.

According to the eleventh embodiment, the P dosage for the pocket is buried only on the CS side. Since the impedance on the CS side is higher than the impedance on the first reset line LRST1 side, the charges injected when the first reset transistor RST11-Tr is turned off are less likely to flow into the CS side. This can result in reducing the reset noise of the storage capacitor CS11 and the floating diffusion FD11.

Twelfth Embodiment

Figure 21:
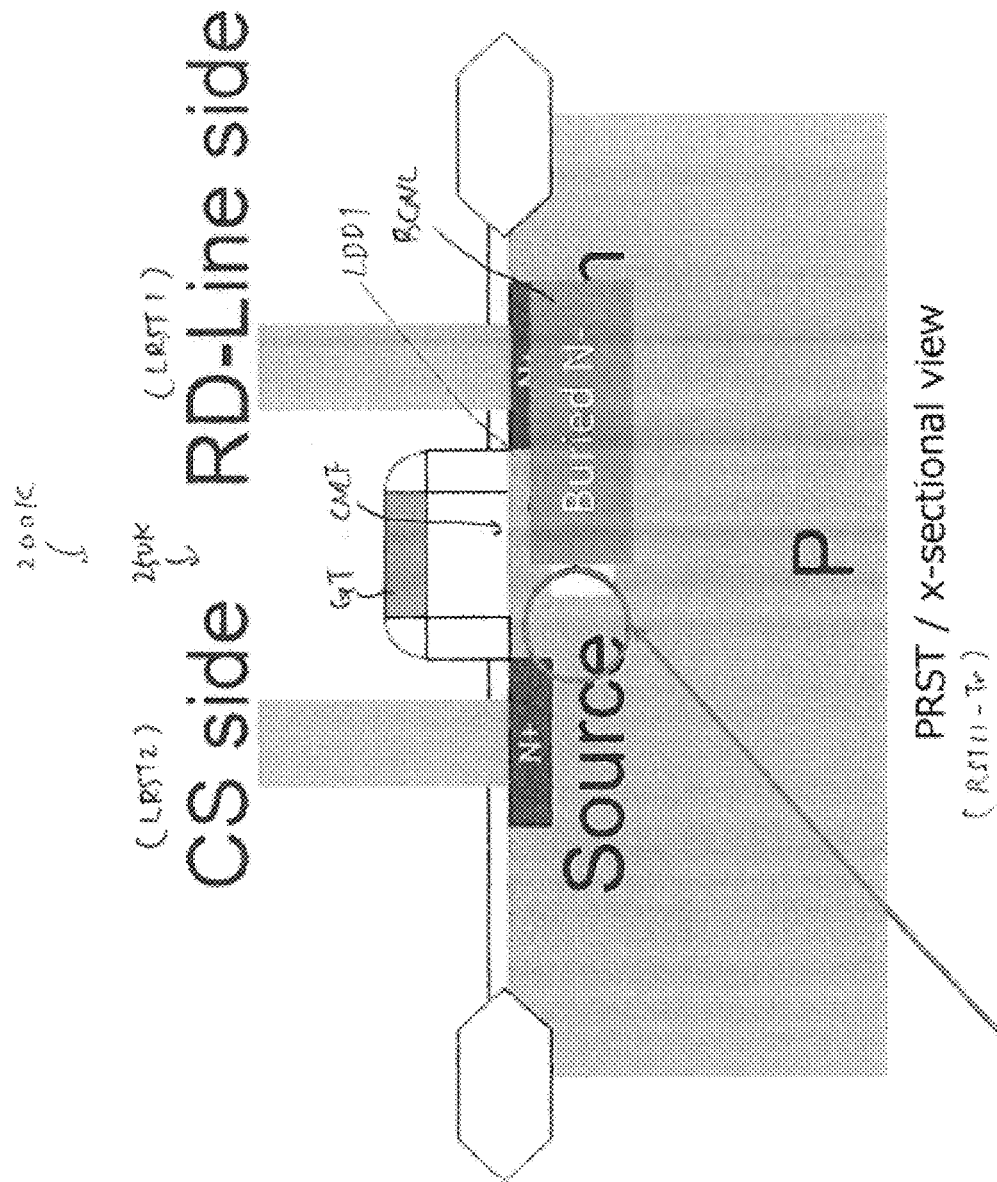
FIG. 21 is a simplified sectional view to illustrate a preferable example configuration of a first reset transistor constituting a pixel relating to a twelfth embodiment of the present invention.
Figure 22:
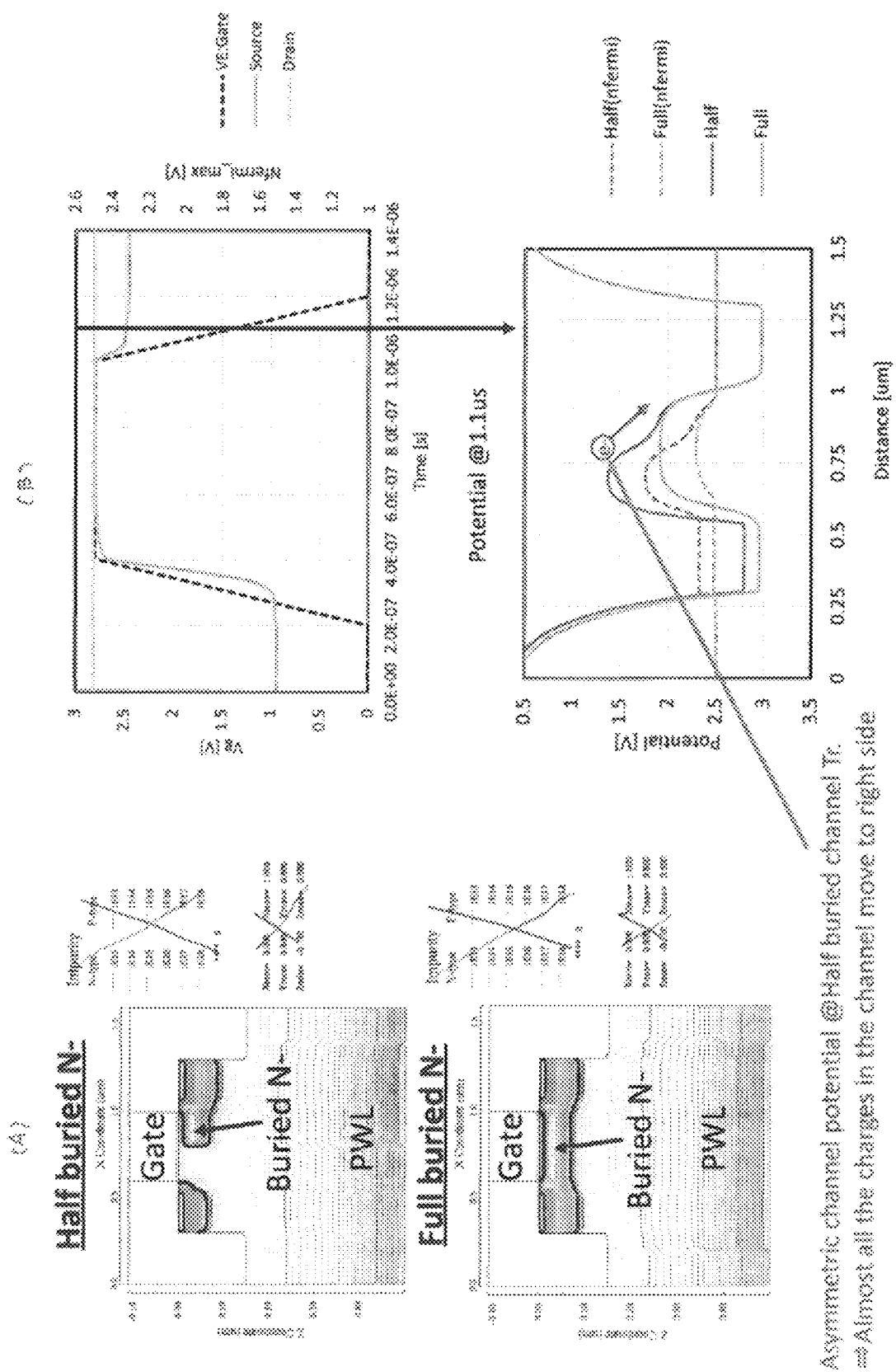
FIG. 22 shows a simulation of how charges move around the first reset transistor when resetting involving noise reduction is performed on the floating diffusion using a noise reducing part relating to the twelfth embodiment of the present invention.

FIG. 21 is a simplified sectional view to illustrate a preferable example configuration of a first reset transistor constituting a pixel relating to a twelfth embodiment of the present invention. FIG. 22 includes views (A) and (B) showing a simulation of how charges move around the first reset transistor when resetting involving noise reduction is performed on the floating diffusion using a noise reducing part relating to the twelfth embodiment of the present invention.

A pixel 200K of the twelfth embodiment differs from the pixel 200 of the first embodiment in the following points. In the pixel 200K relating to the twelfth embodiment, the first reset transistor RST11-Tr is formed by a field effect transistor 250K, where first and second terminals serve as a source-drain diffusion layer, a channel formation region CNLF is formed between the first and second terminals, and a gate electrode GT is arranged on the channel formation region CNLF with an insulator therebetween. A buried channel layer BCNL is formed only on the first terminal side, from among the first and second terminals. The buried channel layer BCNL is contiguous to the first terminal.

According to the twelfth embodiment, the buried N dosage is buried only on the first reset line LRST1 side. Since the impedance on the CS side is higher than the impedance on the first reset line LRST1 side, the charges injected when the first reset transistor RST11-Tr is turned off are less likely to flow into the CS side. This can result in reducing the reset noise of the storage capacitor CS11 and the floating diffusion FD11.

Thirteenth Embodiment

Figure 23:
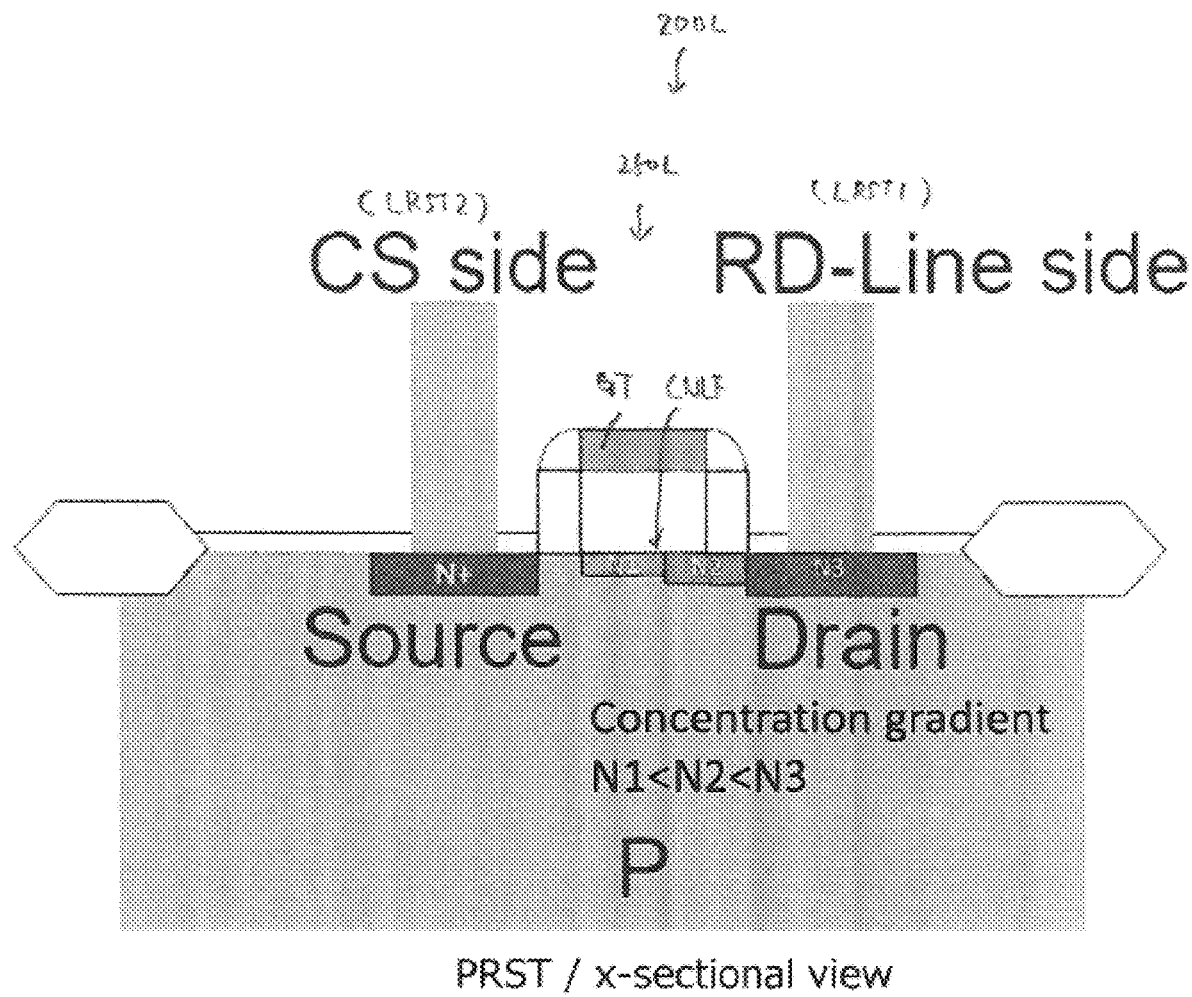
FIG. 23 is a simplified sectional view to illustrate a preferable example configuration of a first reset transistor constituting a pixel relating to a thirteenth embodiment of the present invention.

FIG. 23 is a simplified sectional view to illustrate a preferable example configuration of a first reset transistor constituting a pixel relating to a thirteenth embodiment of the present invention.

A pixel 200L of the thirteenth embodiment differs from the pixel 200 of the first embodiment in the following points. In the pixel 200L relating to the thirteenth embodiment, the first reset transistor RST11-Tr is formed by a field effect transistor 250L, where first and second terminals serve as a source-drain diffusion layer, a channel formation region CNLF is formed between the first and second terminals, and a gate electrode GT is arranged on the channel formation region CNLF with an insulator therebetween. The channel formation region has a concentration gradient such that the impurity concentration is higher on the first terminal (drain) side than on the second terminal (source) side.

According to the twelfth embodiment, the electrons are more likely to move toward the drain since the impurity concentration has a concentration gradient such that the impurity concentration is higher on the first terminal (drain) side than on the second terminal (source) side. This can result in reducing the reset noise of the storage capacitor CS11 and the floating diffusion FD11.

The solid-state imaging devices 10, 10A to 10L described above can be applied, as imaging devices, to electronic apparatuses such as digital cameras, video cameras, mobile terminals, surveillance cameras, and medical endoscope cameras.

Figure 24:
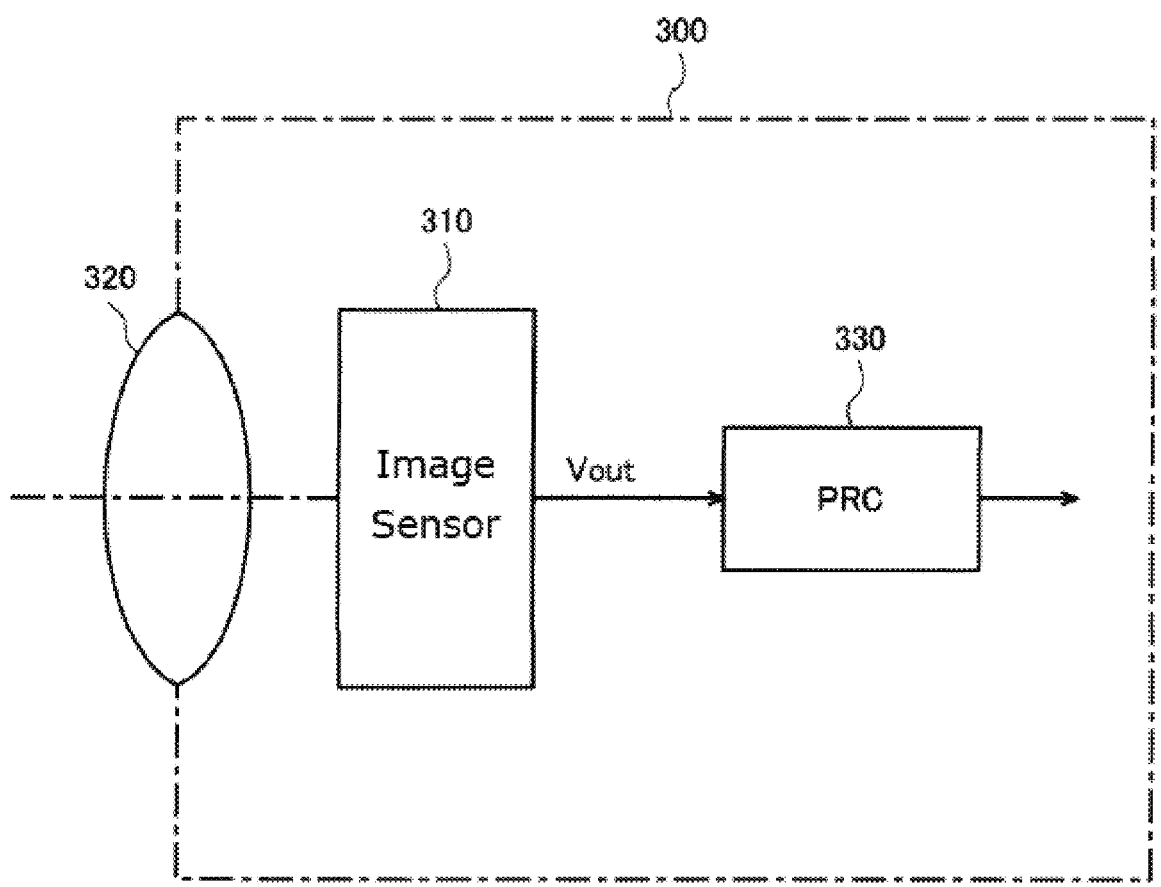
FIG. 24 shows an example configuration of an electronic apparatus to which the solid-state imaging devices relating to the embodiments of the present invention can be applied.

FIG. 24 shows an example configuration of an electronic apparatus including a camera system to which the solid-state imaging devices according to the embodiments of the present invention can be applied.

As shown in FIG. 24, the electronic apparatus 300 includes a CMOS image sensor 310 that can be constituted by any of the solid-state imaging devices 10, 10A to 10L relating to the embodiments of the present invention. The electronic apparatus 300 further includes an optical system (such as a lens) 320 for redirecting the incident light to the pixel region of the CMOS image sensor 310 (to form a subject image). The electronic apparatus 300 includes a signal processing circuit (PRC) 330 for processing the output signals from the CMOS image sensor 310.

The signal processing circuit 330 performs predetermined signal processing on the output signals from the CMOS image sensor 310. The image signals resulting from the processing in the signal processing circuit 330 can be handled in various manners. For example, the image signals can be displayed as a video image on a monitor having a liquid crystal display, printed by a printer, or recorded directly on a storage medium such as a memory card.

As described above, a high-performance, compact, and low-cost camera system can be provided that includes any one of the solid-state imaging devices 10, 10A to 10L as the CMOS image sensor 310. Accordingly, the embodiments of the present invention can provide for electronic apparatuses such as surveillance cameras and medical endoscope cameras, which are used for applications where the cameras are installed under restricted conditions from various perspectives such as the installation size, the number of connectable cables, the length of cables and the installation height.

What is claimed is:
1. A solid-state imaging device comprising:
a pixel part having pixels arranged therein, each pixel including a photoelectric conversion element, each pixel being configured to produce, as a readable pixel signal, a read-out reset signal and a read-out signal with at least two conversion gains, the read-out reset signal corresponding to a reset state and the read-out signal being determined by charges stored in the photoelectric conversion element;

a noise reducing part configured to perform noise reduction on each pixel at least during a reset period; and
a reading part configured to read the pixel signal from the pixel part while controlling the noise reduction performed by the noise reducing part,
wherein each pixel has:
   the photoelectric conversion element configured to store therein, in an exposure period, charges corresponding to an amount of incident light;
   a floating diffusion configured to hold charges transferred thereto so that the charges are read out as a voltage signal, the floating diffusion being configured to convert the charges into voltage determined by a capacitance;
   a reset element configured to perform a reset operation of discharging, into a reset potential, the charges stored at least in the floating diffusion; and
   a storage capacitance element configured to be connected to or disconnected from the floating diffusion according to a conversion gain,
wherein the reset element has:
   a first terminal connected to a first reset line connected to the reset potential; and
   a second terminal connected to a second reset line connected to at least one of the floating diffusion or the storage capacitance element, the floating diffusion being a target to be reset,
wherein, if a control signal of a predetermined level is applied to the reset element in a reset period, electrical conduction is maintained between the first and second terminals,
wherein, at least in a reset period during a read-out operation with at least one of the two conversion gains, the noise reducing part:
   keeps connection between the first reset line and the reset potential during a predetermined first period after the reset period starts;
   keeps the first reset line in a floating state in a second period after the first period elapses, so that the first reset line has high impedance,
wherein the reading part:
   keeps the reset element in a conduction state for a predetermined period of time from a start of the reset period; and
   switches the reset element into a non-conduction state after the first and second periods elapse and when the reset period ends,
wherein the reset element of each pixel is formed by a first reset transistor configured to be switched between a conduction state and a non-conduction state in response to a first reset control signal, and
wherein the noise reducing part includes:
   a second reset transistor connected between the first reset line and the reset potential, the second reset transistor being configured to be switched between a conduction state and a non-conduction state in response to a second reset control signal; and
   a reset control capacitance element connected to the first reset line.

2. The solid-state imaging device of claim 1, wherein the reset control capacitance element has a greater capacitance than the target to be reset.

3. The solid-state imaging device of claim 1, wherein a first reset operation including the noise reduction is controlled by the reading part and the noise reducing part such that:

at a start of the reset period, the first reset transistor and the second reset transistor are switched to a conduction state, the second reset line, to which the target to be reset is connected, is connected to the first reset line, and the first reset line is connected to the reset potential, so that the target to be reset starts discharging charges;
the first reset line remains connected to the reset potential during the predetermined first period after the reset period starts;
after the first period elapses, the second reset transistor is switched into a non-conduction state, and the first reset line is switched into a floating state, so that the first reset line has high impedance; and
after the second period elapses and when the reset period ends, the first reset transistor is switched into a non-conduction state.

4. The solid-state imaging device of claim 3,
wherein each pixel further has:
   a transfer element configured to transfer, in a transfer period following the storing period, the charges stored in the photoelectric conversion element;
   a storage connection element configured to selectively connect together the floating diffusion and the storage capacitance element; and
   a source follower element configured to amplify the voltage signal produced by conversion performed by the floating diffusion and output the amplified voltage signal,
wherein a second reset operation that does not include the noise reduction is controlled by the reading part and the noise reducing part such that during an initial reset read-out operation after exposure, the first reset transistor remains in a non-conduction state and the storage connection element is switched into a non-conduction state to disconnect the storage capacitance element from the floating diffusion, so that charges in the floating diffusion are separated from charges in the storage capacitance element, thereby setting a gain of the floating diffusion to a first conversion gain corresponding to the first capacitance to perform a first conversion gain reset read-out operation.

5. The solid-state imaging device of claim 4,
wherein a first conversion gain signal and a second conversion gain signal corresponding to two conversion gains and having opposite signal directions are read as the pixel signal,
wherein, in s conversion gain signal read-out mode, the reading part:
   keeps the first reset transistor, the second reset transistor, the storage connection element and the transfer element in a conduction state for a predetermined period of time so that the floating diffusion, the storage capacitance element, and the photoelectric conversion element are reset, and switches the transfer element into a non-conduction state so that the first reset operation is performed and an exposure period starts; and subsequently
   sequentially performs a first conversion gain reset read-out operation, a first conversion gain signal read-out operation, a second conversion gain signal read-out operation and a second conversion gain reset read-out operation; and
   performs the first reset operation in the second conversion gain reset read-out operation.

6. The solid-state imaging device of claim 5, wherein in the first conversion gain reset read-out operation, the second reset operation is performed.

7. The solid-state imaging device of claim 6,
wherein the reading part:
- keeps the first reset transistor (reset element), the second reset transistor, the storage connection element and the transfer element in a conduction state for a predetermined period of time so that the floating diffusion, the storage capacitance element, and the photoelectric conversion element are reset, and switches the transfer element into a non-conduction state so that an exposure period starts; subsequently
- switches the storage connection element to a non-conduction state to disconnect the storage capacitance element from the floating diffusion, so that the charges in the floating diffusion are separated from the charges in the storage capacitance element to set the gain of the floating diffusion to the first conversion gain corresponding to the first capacitance;
- in a first reset read-out period, performs the first conversion gain reset read-out operation of reading from the source follower element a first read-out reset signal produced through conversion with the first conversion gain corresponding to the first capacitance of the floating diffusion and processing the first read-out reset signal in a predetermined manner;
- in a first read-out period following a first transfer period following the first reset read-out period, performs the first conversion gain signal read-out operation of reading from the source follower element a first read-out signal produced through conversion with the first conversion gain corresponding to the first capacitance of the floating diffusion and processing the first read-out signal in a predetermined manner;
- subsequently keeps the storage connection element in a conduction state for a predetermined period of time to connect the storage capacitance element to the floating diffusion, so that the charges in the floating diffusion are combined with the charges in the storage capacitance element relating to overflow charges to switch the gain of the floating diffusion to a second conversion gain corresponding to a second capacitance;
- in a second read-out period following a second transfer period following the first read-out period, performs the second conversion gain signal read-out operation of reading from the source follower element a second read-out signal produced through conversion with the second conversion gain corresponding to the second capacitance of the floating diffusion and processing the second read-out signal in a predetermined manner; subsequently
- at a start of the reset period, switches the first reset transistor and the second reset transistor into a conduction state, to connect the second reset line, to which the target to be reset is connected, to the first reset line, and to connect the first reset line to the reset potential, so that the target to be reset starts discharging charges;
- keeps the first reset line connected to the reset potential during the predetermined first period after the reset period starts;
- after the first period elapses, switches the second reset transistor into a non-conduction state, and switches the first reset line into a floating state, so that the first reset line has high impedance;
- after the second period elapses and when the reset period ends, switches the first reset transistor into a non-conduction state; and
- after performing the first reset operation to reset the floating diffusion, performs the second conversion gain reset read-out operation of reading from the source follower element a second reset signal produced through conversion with the second conversion gain corresponding to the second capacitance of the floating diffusion and processing the second reset signal in a predetermined manner.

8. The solid-state imaging device of claim 1,
wherein, in each pixel, the photoelectric conversion element and the storage capacitance element are arranged side by side in one direction,
wherein the pixel part has:
- a pixel array having the pixels arranged therein; and
- a buffer array including repeater buffers, each repeater buffer being configured to generate a control signal to drive at least the first reset transistor, the repeater buffers being arranged between the pixels of the pixel array, and
wherein each repeater buffer is adjacent to a storage capacitance element of an adjacent pixel on one side in the one direction, and adjacent to a dummy storage capacitance element that is adjacent to a photoelectric conversion element of an adjacent pixel on the other side in the one direction.

9. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and
wherein an active area on the first terminal side is larger than an active area on the second terminal side, and the channel formation region is shaped such that a width of the channel formation region is larger on the first terminal side than on the second terminal side.

10. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and
wherein the first and second terminals respectively have a first contact terminal and a second contact terminal for electrical connection with other layers, and
wherein a first resistance between the first contact terminal and under the gate electrode is lower than a second resistance between the second contact terminal and under the gate electrode.

11. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and
wherein one or more first contact terminals are arranged on the first terminal, one or more second contact terminals are arranged on the second terminal, and the first contact terminals outnumber the second contact terminals.

12. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, wherein the gate electrode has contact terminals for establishing electrical connection with other layers, one of the contact terminals is closer to the second terminal, and the other of the contact terminals is closer to the first terminal, and wherein a resistance of the gate electrode between the contact terminal for the gate electrode on the second terminal side and the contact terminal for the gate electrode on the first terminal side is used to make a difference between turn-off times of pulse-shaped reset control signals applied to the contact terminals, so that charges are guided to move from the second terminal side to the first terminal side.

13. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and wherein impedance in the channel formation region between the second terminal and the gate electrode is greater than impedance in the channel formation region between the first terminal and the gate electrode.

14. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and wherein the insulator has a greater thickness in a portion close to the second terminal than in a portion close to the first terminal.

15. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and wherein a low-concentration impurity layer is formed only on the first terminal side, from among the first and second terminals, and the low-concentration impurity layer is contiguous to the first terminal.

16. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, wherein the first and second terminals are respectively contiguous to low-concentration impurity layers, and wherein the low-concentration impurity layer on the second terminal side is contiguous to a pocket layer having higher impurity concentration than a well.

17. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and wherein a buried channel layer is formed only on the first terminal side, from among the first and second terminals, and the buried channel layer is contiguous to the first terminal.

18. The solid-state imaging device of claim 1,
wherein the first reset transistor is formed by a field effect transistor, the first and second terminals serve as a source-drain diffusion layer, a channel formation region is formed between the first and second terminals, and a gate electrode is arranged on the channel formation region with an insulator therebetween, and wherein an impurity concentration in the channel formation region has a concentration gradient such that the impurity concentration is higher on the first terminal side than on the second terminal side.

19. A method for driving a solid-state imaging device, the solid-state imaging device including:
a pixel part having pixels arranged therein, each pixel including a photoelectric conversion element, each pixel being configured to produce, as a readable pixel signal, a read-out reset signal and a read-out signal with at least two conversion gains, the read-out reset signal corresponding to a reset state and the read-out signal being determined by charges stored in the photoelectric conversion element;
a noise reducing part configured to perform noise reduction on each pixel at least during a reset period; and
a reading part configured to read the pixel signal from the pixel part while controlling the noise reduction performed by the noise reducing part,
wherein each pixel has:
the photoelectric conversion element configured to store therein, in an exposure period, charges corresponding to an amount of incident light;
a floating diffusion configured to hold charges transferred thereto so that the charges are read out as a voltage signal, the floating diffusion being configured to convert the charges into voltage determined by a capacitance;
a reset element configured to perform a reset operation of discharging, into a reset potential, the charges stored at least in the floating diffusion; and
a storage capacitance element configured to be connected to or disconnected from the floating diffusion according to a conversion gain,
wherein the reset element has:
a first terminal connected to a first reset line connected to the reset potential; and
a second terminal connected to a second reset line connected to at least one of the floating diffusion or the storage capacitance element, the floating diffusion being a target to be reset,
wherein, if a control signal of a predetermined level is applied to the reset element in a reset period, electrical conduction is maintained between the first and second terminals,
wherein, at least in a reset period during a read-out operation with at least one of the two conversion gains,
the reset element is kept in a conduction state for a predetermined period of time from a start of the reset period,
connection is kept between the first reset line and the reset potential during a predetermined first period after the reset period starts,
the first reset line is kept in a floating state in a second period after the first period elapses, so that the first reset line has high impedance, the reset element is switched into a non-conduction state after the first and second periods elapse and when the reset period ends, wherein the reset element of each pixel is formed by a first reset transistor configured to be switched between a conduction state and a non-conduction state in response to a first reset control signal, and wherein the noise reducing part includes:
  a second reset transistor connected between the first reset line and the reset potential, the second reset transistor being configured to be switched between a conduction state and a non-conduction state in response to a second reset control signal; and
  a reset control capacitance element connected to the first reset line.

20. An electronic apparatus comprising:
a solid-state imaging device; and
an optical system for forming a subject image on the solid-state imaging device,
wherein the solid-state imaging device includes:
  a pixel part having pixels arranged therein, each pixel including a photoelectric conversion element, each pixel being configured to produce, as a readable pixel signal, a read-out reset signal and a read-out signal with at least two conversion gains, the read-out reset signal corresponding to a reset state and the read-out signal being determined by charges stored in the photoelectric conversion element;
  a noise reducing part configured to perform noise reduction on the each pixel at least during a reset period; and
  a reading part configured to read the pixel signal from the pixel part while controlling the noise reduction performed by the noise reducing part,
wherein each pixel has:
  the photoelectric conversion element configured to store therein, in an exposure period, charges corresponding to an amount of incident light;
  a floating diffusion configured to hold charges transferred thereto so that the charges are read out as a voltage signal, the floating diffusion being configured to convert the charges into voltage determined by a capacitance;
  a reset element configured to perform a reset operation of discharging, into a reset potential, the charges stored at least in the floating diffusion; and
  a storage capacitance element configured to be connected to or disconnected from the floating diffusion according to a conversion gain, wherein the reset element has:
  a first terminal connected to a first reset line connected to the reset potential; and
  a second terminal connected to a second reset line connected to at least one of the floating diffusion or the storage capacitance element, the floating diffusion being a target to be reset, wherein, if a control signal of a predetermined level is applied to the reset element in a reset period, electrical conduction is maintained between the first and second terminals, wherein, at least in a reset period during a read-out operation with at least one of the two conversion gains, the noise reducing part:
  keeps connection between the first reset line and the reset potential during a predetermined first period after the reset period starts; and
  keeps the first reset line in a floating state in a second period after the first period elapses, so that the first reset line has high impedance, wherein the reading part:
  keeps the reset element in a conduction state for a predetermined period of time from a start of the reset period; and
  switches the reset element into a non-conduction state after the first and second periods elapse and when the reset period ends, wherein the reset element of each pixel is formed by a first reset transistor configured to be switched between a conduction state and a non-conduction state in response to a first reset control signal, and wherein the noise reducing part includes:
  a second reset transistor connected between the first reset line and the reset potential, the second reset transistor being configured to be switched between a conduction state and a non-conduction state in response to a second reset control signal; and
  a reset control capacitance element connected to the first reset line.

* * * * *